(12) United States Patent
Iwata et al.

(10) Patent No.: US 7,271,799 B2
(45) Date of Patent: Sep. 18, 2007

(54) DISPLAY DRIVER, DISPLAY DEVICE, AND PORTABLE ELECTRONIC APPARATUS

(75) Inventors: Hiroshi Iwata, Nara (JP); Akihide Shibata, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 671 days.

(21) Appl. No.: 10/844,567

(22) Filed: May 13, 2004

(65) Prior Publication Data

US 2004/0227748 A1  Nov. 18, 2004

(30) Foreign Application Priority Data

May 14, 2003  (JP) .............................. 2003-136343

(51) Int. Cl.
*G09G 5/00* (2006.01)
(52) U.S. Cl. .......................... 345/204; 345/98
(58) Field of Classification Search .................. 345/98, 345/100, 204, 205, 206
See application file for complete search history.

(56) References Cited

U.S. PATENT DOCUMENTS

| | | | |
|---|---|---|---|
| 4,881,108 A | 11/1989 | Yoshikawa | |
| 5,403,764 A | 4/1995 | Yamamoto | |
| 5,708,451 A * | 1/1998 | Baldi .......................... | 345/75.2 |
| 5,805,500 A * | 9/1998 | Campardo et al. ......... | 365/185.2 |
| 6,335,554 B1 | 1/2002 | Yoshikawa | |
| 6,434,053 B1 | 8/2002 | Fujiwara | |
| 6,646,283 B1 * | 11/2003 | Akimoto et al. ............... | 257/30 |
| 6,764,902 B2 * | 7/2004 | Kobayashi et al. ......... | 438/257 |
| 6,769,603 B2 * | 8/2004 | Nagai et al. ................. | 235/375 |
| 6,992,652 B2 * | 1/2006 | Koyama ....................... | 345/98 |
| 7,075,139 B2 * | 7/2006 | Kobayashi et al. ......... | 257/314 |
| 7,167,147 B2 * | 1/2007 | Tanaka et al. ................. | 345/82 |
| 2001/0007447 A1 * | 7/2001 | Tanaka et al. ................. | 345/87 |
| 2001/0040252 A1 * | 11/2001 | Kobayashi et al. ......... | 257/314 |
| 2003/0142044 A1 * | 7/2003 | Berry ........................... | 345/55 |

FOREIGN PATENT DOCUMENTS

| | | |
|---|---|---|
| JP | 5-81072 B2 | 11/1993 |
| JP | 5-304277 A | 11/1993 |
| JP | 9-116119 A | 5/1997 |
| JP | 2001-156188 A | 6/2001 |
| JP | 2001-230332 A | 8/2001 |
| JP | 2001-512290 A | 8/2001 |
| JP | 2005172880 A * | 6/2005 |
| WO | WO99/07000 A2 | 2/1999 |

* cited by examiner

*Primary Examiner*—Richard Hjerpe
*Assistant Examiner*—Jean Lesperance
(74) *Attorney, Agent, or Firm*—Birch, Stewart, Kolasch & Birch, LLP

(57) ABSTRACT

A display driver includes a display driving part for receiving image data and outputting a drive signal to a display panel; a nonvolatile memory part for storing control information for controlling output of the display driving part; and a control part for controlling output of the display driving part on the basis of the control information, wherein the nonvolatile memory part has a nonvolatile memory cell, and the nonvolatile memory cell includes a gate electrode formed on a semiconductor layer via a gate insulating film, a channel region disposed under the gate electrode, diffusion regions disposed on both sides of the channel region and having a conductive type opposite to that of the channel region, and memory functional units formed on both sides of the gate electrode and having a function for retaining charges.

15 Claims, 16 Drawing Sheets

DISPLAY DRIVER, DISPLAY DEVICE, AND PORTABLE ELECTRONIC APPARATUS

CROSS-REFERENCE TO RELATED APPLICATION

This application is related to Japanese patent application No. 2003-136343 filed on May 14, 2003, whose priority is claimed under 35 USC § 119, the disclosure of which is incorporated by reference in its entirety.

BACKGROUND OF THE INVENTION

1. Field of the Invention

The present invention relates to a display driver, a display device having the display driver, and a portable electronic apparatus having the display device. More specifically, the present invention relates to a display driver having a memory cell which is constructed by a field effect transistor and includes a memory functional unit having a function for retaining charges or polarizations, a display device including the display driver, and a portable electronic apparatus including the display.

2. Description of the Related Art

In a display using a liquid crystal, an organic EL or the like, various set values are preset. For example, a gamma value as an example of the set value is used to correct the relation between an inputted tone signal and brightness on the display. In a conventional display device, the set values are stored in a nonvolatile memory such as an EEPROM attached to a display driver for driving the display device. Concretely, a chip on which an EEPROM is mounted is externally attached to the display driver for driving the display device.

A flash memory as the mode of the EEPROM will be described below as an example. FIG. 24 is a schematic sectional view showing an example of the flash memory cell. Shown in FIG. 24 are a semiconductor substrate 901, a floating gate 902, a word line (control gate) 903, a diffusion layer source line 904, a diffusion layer bit line 905, a device isolation region 906, and an insulating film 907.

The flash memory cell stores memory information in accordance with an amount of charges in the floating gate. In a memory cell array constructed by arranging memory cells, an operation of rewriting/reading for a desired one of the memory cells can be performed by selecting a specific word line and a specific bit line and applying a predetermined voltage to them.

FIG. 25 is a graph schematically showing a drain current (Id)-gate voltage (Vg) characteristic when the amount of charges in the floating gate in the flash memory changes. When the amount of negative charges in the floating gate increases, the threshold increases and the Id-Vg curve shifts almost in parallel in the Vg increasing direction (see, for example, Japanese Unexamined Patent Publication No. Hei 05-304277 (1993)).

However, since the EEPROM has the floating gate, two polysilicon layers for forming the floating gate and control gate have to be patterned, and a process is complicated. It disturbs reduction in the cost of a display driver having the EEPROM. Reduction in the cost of the display driver is demanded, and it is also desired to mount a nonvolatile memory which can be manufactured at low cost in place of the EEPROM.

SUMMARY OF THE INVENTION

The present invention has been achieved in consideration of the problems and its object is to provide a display driver having a function for storing a set value of a display device at low cost.

The present invention provides a display driver including: a display driving part for receiving image data and outputting a drive signal to a display panel; a nonvolatile memory part for storing control information for controlling output of the display driving part; and a control part for controlling output of the display driving part on the basis of the control information, wherein the nonvolatile memory part has a nonvolatile memory cell which includes a gate electrode formed on a semiconductor layer via a gate insulating film, a channel region disposed under the gate electrode, diffusion regions disposed on both sides of the channel region and having a conductive type opposite to that of the channel region, and memory functional units formed on both sides of the gate electrode and having a function for retaining charges.

According to the present invention, the display driver has a nonvolatile memory cell having the above-described construction. Size reduction of the nonvolatile memory cell is easily achieved and the manufacturing process is simpler than that of the EEPROM having the floating gate, so that the manufacturing cost is low. Therefore, the display driver having the nonvolatile memory cell is provided at a low cost. Since the difference between the current for writing and the current for erasing can be easily made large in the nonvolatile memory cell, the speed of reading information stored in the nonvolatile memory cell increases and a reading circuit for the nonvolatile memory cell can be simplified.

According to an aspect of the present invention, in the display driver, the display driving part is formed together with the nonvolatile memory part and the control part on a single chip.

According to the aspect, the display driver is formed on the single chip, and the number of chips to be used can be decreased, so that the cost of the driver can be reduced.

Further, since the nonvolatile memory cell can be formed by a process having a high affinity with the process of forming a normal standard transistor, the nonvolatile memory cell and the standard transistor can be easily formed simultaneously. Therefore, the number of processes for forming both the nonvolatile memory cell and the standard transistor can be minimized.

According to another aspect of the present invention, the display driver further includes a static random access memory.

According to the aspect, by transferring information stored in the nonvolatile memory cell to a static random access memory and performing a reading operation on the static random access memory, the stored information can be read at higher speed. Further, the number of times of reading the nonvolatile memory cell can be largely reduced, so that deterioration of the stored information due to application of a voltage at the time of reading is prevented, and reliability of information retention of the nonvolatile memory cell can be improved. Since the static random access memory can be constructed by a normal MOSFET, a process of forming both of the nonvolatile memory cell and the static random access memory is not complicated.

According to still another aspect of the present invention, the display driver further includes power supply/stop means for supplying and stopping power to the display driving part, wherein the nonvolatile memory part transfers the stored control information to the static random access memory each time the power supply/stop means starts supplying the power to the display driving part.

According to the aspect, the control information is transferred from the nonvolatile memory cell to the static random access memory at the time of turn-on of the power for the display driver. Therefore, the operation of the display driver can be prevented from being interfered by the transferring operation.

According to yet another aspect of the present invention, the display driver further includes means for externally rewriting the control information stored in the nonvolatile memory part.

According to the aspect, information stored in the nonvolatile memory cell can be rewritten externally. Consequently, even after the display has been completed by attaching the display driver to the display panel or an apparatus equipped with the display device has been completed, the information stored in the nonvolatile memory cell can be changed. Therefore, for example, information for image adjustment can be rewritten after testing the completed display device, so that uneven quality of the display devices can be suppressed. In the case where the display device deteriorates with age in the apparatus equipped with the display device, the deterioration can be compensated by rewriting the information for image adjustment.

According to the present invention, the display driver has a feature in that the nonvolatile memory part stores information for controlling a drive signal outputted from the display driving part.

According to the aspect, an image can be displayed with high reproducibility and unevenness in picture quality among display devices can be suppressed.

According to yet another aspect of the present invention, the display driver further includes collating means, wherein control information including a first sign is stored in the nonvolatile memory part, image data including a second sign is inputted to the display driving part, the collating means collates the first and second signs with each other and, when the first and second signs do not match each other, the display driving part prevents at least a part of the image data from being output.

In the aspect, the image data includes both a still image and a moving image. According to the aspect, for example, the collating means compares the first sign with the second sign. Only when a match is determined, a normal image can be displayed. In such the manner, the normal image can be displayed only on a specific display device, the present invention can be applied to enhancement of security and delivery of pay images.

According to yet another aspect of the present invention, the display driver further includes collating means, wherein control information including a first sign is stored in the nonvolatile memory part, image data including a second sign is inputted to the display driving part, the collating means collates the first and second signs each other to determine whether the first and second signs match or not, and the display driving part outputs a drive signal to the display panel the drive signal varying according to a determination of the collating means.

Since the normal image can be displayed only on a specific display device in the aspect, the present invention can be applied to enhancement of security and delivery of pay images.

According to yet another aspect of the present invention, the memory functional unit is formed so that at least a part of the memory functional unit overlaps with a part of the diffusion region.

According to the aspect, the reading speed of the nonvolatile memory cell can be sufficiently increased. Therefore, the operation of the display driver can be performed at a higher speed.

According to yet another aspect of the present invention, the memory functional unit includes a retaining film having a function for retaining charges, and a surface of the retaining film is disposed almost parallel with the surface of the gate insulating film.

According to the aspect, uneven memory effect of the nonvolatile memory cells can be reduced, so that uneven read current of the nonvolatile memory cells can be suppressed. Further, a change in the characteristics of the nonvolatile memory cell in an information retaining state can be reduced, so that the retention characteristic of the nonvolatile memory cell can be improved. Therefore, reliability of the display driver can be improved.

According to yet another aspect of the present invention, the retaining film having the function for retaining charges is disposed almost parallel with a side surface of the gate electrode.

According to the aspect, rewriting speed of the nonvolatile memory cell increases, so that the rewriting operation of the nonvolatile memory cell can be performed at a higher speed. Therefore, the time required to rewrite information stored in the nonvolatile memory cell of the display driver is shortened, and the cost for rewriting is reduced.

According to yet another aspect of the present invention, the memory functional unit includes a retaining film having a function for retaining charges and an insulating film for separating the retaining film from one of the channel region and the semiconductor layer, and the insulating film has a thickness thinner than the gate insulating film and not thinner than 0.8 nm.

According to the aspect, the voltage of the writing and erasing operations of the nonvolatile memory cell can be decreased, or the writing and erasing operations can be performed at a higher speed. Since the memory effect of the memory cell improves, higher reading speed of the nonvolatile memory part can be achieved. Therefore, a lower power consumption and a higher speed operation of the display driver can be realized.

According to yet another aspect of the present invention, the memory functional unit includes a retaining film having a function for retaining charges and an insulating film for separating the retaining film from one of the channel region and the semiconductor layer, and the insulating film has a thickness thicker than the gate insulating film and not thicker than 20 nm.

According to the aspect, the retention characteristic can be improved without worsening the short channel effect of the nonvolatile memory cell. Consequently, even when the integrated density of the nonvolatile memory cell is increased, a sufficient retention characteristic can be obtained. Therefore, the performance of the display driver can be improved.

The present invention also provides a display device including the above-described display driver and a display panel driven by the display driver.

Since the display of the present invention includes the display driver having a nonvolatile memory, the manufacturing cost can be reduced.

According to an aspect of the present invention, devices constituting the display driver are formed on a panel substrate constituting the display panel.

According to the aspect, it is unnecessary to externally attach the display driver to the display panel but the display driver and the display panel can be formed integrally, so that the manufacturing cost of the display device can be reduced.

The present invention also provides a portable electronic apparatus including the above-described display.

Since the portable electronic apparatus of the present invention has the display, the portable electronic apparatus can be manufactured at a low cost and the performance of the portable electronic apparatus can be improved. Therefore, a cheap or high-performance portable electronic apparatus can be obtained.

DETAILED DESCRIPTION OF THE INVENTION

Figure 1:
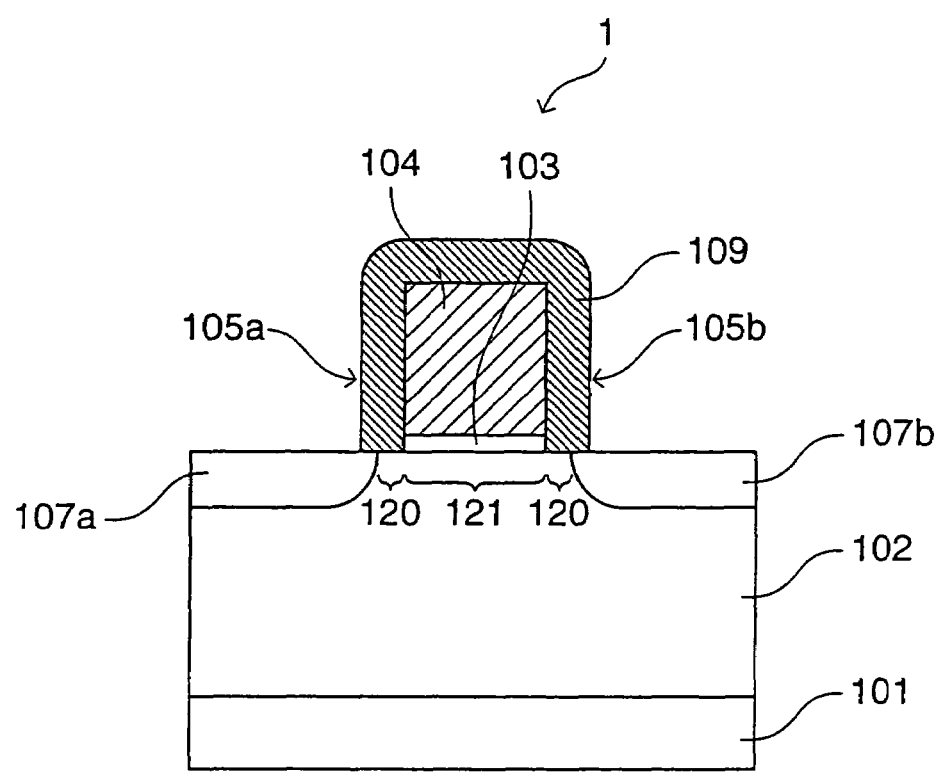
FIG. 1 is a schematic sectional view showing a main part of a memory cell (first embodiment) constituting a nonvolatile memory part in a display driver according to the present invention.

A display driver according to the present invention is mainly constructed by a display driving part and a nonvolatile memory part.

A memory cell constituting the nonvolatile memory part mainly includes a semiconductor layer, a gate insulating film, a gate electrode, a channel region, a diffusion region, and a memory functional unit. Herein, the channel region is normally a region of the same conductive type as that of the semiconductor layer and denotes a region immediately below the gate electrode. The diffusion region denotes a region of the conductive type opposite to that of the channel region.

Concretely, the memory cell of the present invention may be constructed by a region of a first conductive type as a diffusion region, a region of a second conductive type as a channel region, a memory functional unit disposed across a border of the regions of the first and second conductive types, and an electrode provided via a gate insulating film. It is suitable that the memory cell of the present invention is constructed by a gate electrode formed on a gate insulating film, two memory functional units formed on both sides of the gate electrode, two diffusion regions disposed on the opposite sides of the gate electrode of the memory functional units, and a channel region disposed below the gate electrode.

In the semiconductor device of the present invention, the semiconductor layer is formed on the semiconductor substrate, preferably, on a well region of the first conductive type formed in the semiconductor substrate.

The semiconductor substrate is not particularly limited as long as it can be used for a semiconductor device, and an example thereof includes a bulk substrate made of an element semiconductor such as silicon, germanium or the like or a compound semiconductor such as silicon germanium, GaAs, InGaAs, ZnSe or GaN. As a substrate having a semiconductor layer on its surface, various substrates such as an SOI (Silicon on Insulator) substrate, an SOS substrate and a multilayer SOI substrate, or a glass or plastic substrate having thereon a semiconductor layer may be used. In particular, a silicon substrate and an SOI substrate having a semiconductor layer on its surface are preferable. The semiconductor substrate or semiconductor layer may be single crystal (formed by, for example, epitaxial growth), polycrystal, or amorphous although an amount of current flowing therein varies a little.

On the semiconductor layer, preferably, a device isolation region is formed. Further, a single layer or multilayer structure may be formed by a combination of devices such as a transistor, a capacitor and a resistor, a circuit formed by the devices, a semiconductor device, and an interlayer insulating film. The device isolation region can be formed by any of various device isolation films such as an LOCOS film, a trench oxide film and an STI film. The semiconductor layer may be of the P or N conductive type. In the semiconductor layer, preferably, at least one well region of the first conductive type (P or N type) is formed. An impurity concentration which is within a known range in this field can be used as impurity concentration in the semiconductor layer and the well region. In the case of using the SOI substrate as the semiconductor layer, the well region may be formed in the surface semiconductor layer and a body region may be provided below a channel region.

The gate insulating film is not particularly limited as long as it is usually used for a semiconductor device, and examples thereof include a single-layer film or a laminated film of an insulating film such as a silicon oxide film or a silicon nitride film, or a high dielectric constant film such as an aluminum oxide film, a titanium oxide film, a tantalum oxide film or a hafnium oxide film. Particularly, a silicon oxide film is preferable. The gate insulating film has a thickness of, for example, about 1 to 20 nm, preferably, about 1 to 6 nm. The gate insulating film may be formed only immediately below the gate electrode or formed so as to be larger (wider) than the gate electrode.

The gate electrode is formed in a shape which is usually used for a semiconductor device or a shape having a recess in a lower end portion on the gate insulating film. The gate electrode is formed preferably in an integral form without being separated by a single-layered or multilayer conductive film. The gate electrode may be disposed in a state where it is separated by a single-layered or multilayer conductive film. The gate electrode may have a side-wall insulating film on its sidewalls. Usually, the gate electrode is not particularly limited as long as it is used for a semiconductor device, and examples of thereof include a conductive film, for example, a single-layered or multilayer film made of polysilicon, a metal such as copper or aluminum, a high-refractory metal such as tungsten, titanium or tantalum, and a silicide or the like with the high refractory metal. Suitable thickness of the gate electrode is, for example, about 50 to 400 nm. Below the gate electrode, a channel region is formed.

Preferably, the gate electrode is formed only on the sidewalls of the memory functional unit or does not cover the top part of the memory functional unit. By such arrangement, a contact plug can be disposed closer to the gate electrode, so that reduction in the size of the memory cell is facilitated. It is easy to manufacture the memory cell having such simple arrangement, so that the yield in production can be improved.

The memory functional unit has at least the function of retaining charges (hereinafter, described as "charge retaining function"). In other words, the memory functional unit has the function of accumulating and retaining charges, the function of trapping charges or the function of holding a charge polarization state. The function is exhibited, for example, when the memory functional unit includes a film or region having the charge retaining function. Examples of elements having the above function include: silicon nitride; silicon; a silicate glass including impurity such as phosphorus or boron; silicon carbide; alumina; a high dielectric material such as hafnium oxide, zirconium oxide or tantalum oxide; zinc oxide; ferroelectric; metals, and the like. Therefore, the memory functional unit can be formed by, for example, a single-layered or laminated structure of: an insulating film including a silicon nitride film; an insulating film having therein a conductive film or a semiconductor layer; an insulating film including at least one conductor or semiconductor dot; or an insulating film including a ferroelectric film of which inner charge is polarized by an electric field and in which the polarized state is held. Particularly, the silicon nitride film is preferable for the reason that the silicon nitride film can obtain a large hysteretic characteristic since a number of levels of trapping charges exist. In addition, the charge retention time is long and a problem of charge leakage due to occurrence of a leak path does not occur, so that the retention characteristics are good. Further, silicon nitride is a material which is used as standard in an LSI process.

By using the insulating film including a film having the charge retaining function such as a silicon nitride film as the memory functional unit, reliability of storage and retention can be increased. Since the silicon nitride film is an insulator, even in the case where a charge leak occurs in part of the silicon nitride film, the charges in the whole silicon nitride film are not lost immediately. In the case of arranging a plurality of memory cells, even when the distance between the memory cells is shortened and neighboring memory cells come into contact with each other, unlike the case where the memory functional units are made of conductors, information stored in the memory functional units is not lost. Further, a contact plug can be disposed closer to the memory functional unit. In some cases, the contact plug can be disposed so as to be overlapped with the memory functional unit. Thus, reduction in size of the memory cell is facilitated.

In order to increase the reliability of storage and retention, the film having the charge retaining function does not always have to have a film shape. Preferably, films having the charge retaining function exist discretely in an insulating film. Concretely, it is preferable that the films having the charge retaining function in the shape of dots be spread in a material which is hard to retain charges, for example, in a silicon oxide.

In the case of using a conductive film or semiconductor layer as the charge retaining film, preferably, the conductive film or semiconductor layer is disposed via an insulating film so that the charge retaining film is not in direct contact with the semiconductor layer (semiconductor substrate, well region, body region, source/drain regions or diffusion region) or a gate electrode. For example, a laminated structure of the conductive film and the insulating film, a structure in which conductive films in the form of dots are spread in the insulating film, a structure in which the conductive film is disposed in a part of a sidewall insulating film formed on sidewalls of the gate, and the like can be mentioned.

It is preferable to use the insulating film having therein the conductive film or semiconductor layer as a memory functional unit for the reason that an amount of injecting charges into the conductor or semiconductor can be freely controlled and multilevel values can be easily obtained.

Further, it is preferable to use the insulating film including at least one conductor or semiconductor dot as the memory functional unit for the reason that it becomes easier to perform writing and erasing by direct tunneling of charges, and reduction in power consumption can be achieved.

Alternatively, as a memory functional unit, a ferroelectric film such as PZT or PLZT in which the polarization direction changes according to the electric field may be used. In this case, charges are substantially generated in the surface of the ferroelectric film by the polarization and are held in that state. It is therefore preferable since the ferroelectric film can obtain a hysteresis characteristic similar to that of a film to which charges are supplied from the outside of the film having the memory function and which traps charges. In addition, it is unnecessary to inject charges from the outside of the film in order to retain charges in the ferroelectric film, and the hysteresis characteristic can be obtained only by the polarization of the charge in the film, so that writing/erasing can be performed at high speed.

As the insulating film constructing the memory functional unit, a film having a region or function of suppressing escape of charges is suitable. An example of the film having the function of suppressing escape of charges includes a silicon oxide film.

The charge retaining film included in the memory functional unit is disposed on both sides of the gate electrode directly or via an insulating film, and is disposed on the semiconductor layer (semiconductor substrate, well region, body region or source/drain region, or diffusion region) directly or via a gate insulating film. Preferably, the charge retaining film on both sides of the gate electrode is formed so as to cover all or part of the sidewalls of the gate electrode directly or via the insulating film. In an application example, in the case where the gate electrode has a recess in its lower end, the charge retaining film may be formed so as to completely or partially bury the recess directly or via an insulating film.

The diffusion regions can function as source and drain regions and have the conductive type opposite to that of the semiconductor layer or well region. In the junction between the diffusion region and the semiconductor layer or well region, preferably, impurity concentration is high for the reason that hot electrons or hot holes are generated efficiently with low voltage, and high-speed operation can be performed with lower voltage. The junction depth of the diffusion region is not particularly limited but can be appropriately adjusted in accordance with the performance or the like of a semiconductor memory device to be obtained. In the case of using an SOI substrate as a semiconductor substrate, the diffusion region may have a junction depth smaller than the thickness of the surface semiconductor layer. It is preferable that the diffusion region has junction depth almost the same as that of the surface semiconductor layer.

The diffusion region may be disposed so as to overlap with an end of the gate electrode, so as to match an end of the gate electrode, or so as to be offset from an end of the gate electrode. The case of offset is particularly preferable because easiness of inversion of the offset region below the charge retaining film largely changes in accordance with an amount of charges accumulated in the memory functional unit when voltage is applied to the gate electrode, the memory effect increases, and a short channel effect is reduced. However, when the diffusion region is offset too much, drive current between the diffusion regions (source and drain) decreases conspicuously. Therefore, it is preferable that the offset amount, that is, the distance to the diffusion area closer to one of the gate electrode ends in the gate length direction is shorter than the thickness of the charge retaining film extending in the direction parallel with the gate length direction. It is particularly important that at least a part of the film or region having the charge retaining function in the memory functional unit is overlapped with part of the diffusion region. This is because the essence of the memory cell as a component of the semiconductor memory device is to rewrite stored information by an electric field which is applied across the memory functional unit in accordance with the voltage difference between the gate electrode which exists only in the sidewall part of the memory functional unit and the diffusion region.

A part of the diffusion region may extend at a level higher than the surface of the channel region or the under face of the gate insulating film. In this case, it is suitable that, on the diffusion region formed in the semiconductor substrate, the conductive film integrated with the diffusion region is laminated. The conductive film may be made of semiconductor such as polysilicon or amorphous silicon, silicide, the above-described metals, high-refractory metals, or the like. In particular, polysilicon is preferred. Since impurity diffusion speed of polysilicon is much faster than that of the semiconductor layer, it is easy to make the junction depth of the diffusion region in the semiconductor layer shallow and to suppress the short channel effect. In this case, preferably, a part of the diffusion region is disposed so as to sandwich at least a part of the memory functional unit in cooperation with the gate electrode.

The memory cell of the present invention can be formed by a normal semiconductor process, for example, a method similar to the method of forming the sidewall spacer having the single-layer or laminated structure on the sidewalls of the gate electrode. Concrete examples of the method include; a method of forming the gate electrode, after that, forming a single-layer film or laminated film including the charge retaining film such as a film having the function of retaining charges (hereinafter, described as "charge retaining film"), charge retaining film/insulating film, insulating film/ charge retaining film, or insulating film/charge retaining film/insulating film, and etching back the formed film under suitable conditions so as to leave the films in a sidewall spacer shape; a method of forming an insulating film or charge retaining film, etching back the film under suitable conditions so as to leave the film in the sidewall spacer shape, further forming the charge retaining film or insulating film, and similarly etching back the film so as to leave the film in the sidewall spacer shape; a method of applying or depositing an insulating film material in which particles made of a charge retaining material are spread on the semiconductor layer including the gate electrode and etching back the material under suitable conditions so as to leave the insulating film material in a sidewall spacer shape; and a method of forming a gate electrode, after that, forming the single-layer film or laminated film, and patterning the film with a mask. According to another method, before the gate electrode is formed, charge retaining film, charge retaining film/insulating film, insulating film/charge retaining film, insulating film/charge retaining film/insulating film, or the like is formed. An opening is formed in a region which becomes the channel region of these films, a gate electrode material film is formed on the entire surface of the opening, and the gate electrode material film is patterned in a shape including the opening and larger than the opening. As described above, the memory cell of the present invention can be formed by a considerably simple process in comparison with an EEPROM having a floating gate. In addition, since the process of forming the memory cell of the present invention has high affinity with the process of forming a normal MOSFET, the memory cell and the MOSFET are formed on a single chip easily.

In the case of constructing the memory cell array by arranging memory cells of the present invention, the best mode of the memory cell satisfies all of the requirements: for example, (1) the gate electrodes of a plurality of memory cells are integrated and have the function of a word line; (2) the memory functional units are formed on both sides of the word line; (3) an insulator, particularly, a silicon nitride film retains charges in the memory functional unit; (4) the memory functional unit is constructed by an ONO (Oxide Nitride Oxide) film and the silicon nitride film has a surface almost parallel with the surface of the gate insulating film; (5) a silicon nitride film in the memory functional unit is isolated from a word line and a channel region via a silicon oxide film; (6) the silicon nitride film and a diffusion region in the memory functional unit are overlapped; (7) the thickness of the insulating film separating the silicon nitride film having the surface which is almost parallel with the surface of the gate insulating film from the channel region or semiconductor layer and the thickness of the gate insulating film are different from each other; (8) an operation of writing/erasing one memory cell is performed by a single word line; (9) there is no electrode (word line) having the function of assisting the writing/erasing operation on the memory functional unit; and (10) in a portion in contact with the diffusion region immediately below the memory functional unit, a region of high concentration of impurity whose conductive type is opposite to that of the diffusion region is provided. It may be sufficient for the memory cell to satisfy even one of the requirements.

A particularly preferable combination of the requirements is, for example, (3) an insulator, particularly, a silicon nitride film retains charges in the memory functional unit, (6) the insulating film (silicon nitride film) and the diffusion region in the memory functional unit are overlapped, and (9) there is no electrode (word line) having the function of assisting the writing/erasing operation on the memory functional unit.

In the case where the memory cell satisfies the requirements (3) and (9), it is very useful for the following reasons.

First, the bit line contact can be disposed closer to the memory functional unit on the word line sidewall or even when the distance between memory cells is shortened, a plurality of memory functional units do not interfere with each other, and stored information can be held. Therefore, reduction in size of the memory cell is facilitated. In the case where the charge retaining region in the memory functional unit is made of a conductor, as the distance between memory cells decreases, interference occurs between the charge retaining regions due to capacitive coupling, so that stored information cannot be held.

In the case where the charge retaining region in the memory functional unit is made of an insulator (for example, a silicon nitride film), it becomes unnecessary to make the memory functional unit independent for each memory cell. For example, the memory functional units formed on both sides of a single word line shared by a plurality of memory cells do not have to be isolated for each memory cell. The memory functional units formed on both sides of one word line can be shared by a plurality of memory cells sharing the word line. Consequently, a photo etching process for isolating the memory functional unit becomes unnecessary, and the manufacturing process is simplified. Further, a margin for positioning in the photolithography process and a margin for film reduction by etching become unnecessary, so that the margin between neighboring memory cells can be reduced. Therefore, as compared with the case where the charge retaining region in the memory functional unit is made of a conductor (for example, polysilicon film), even when the memory functional unit is formed at the same microfabrication level, a memory cell occupied area can be reduced. In the case where the charge retaining region in the memory functional unit is made of a conductor, the photo etching process for isolating the memory functional unit for each memory cell is necessary, and a margin for positioning in the photolithography process and a margin for film reduction by etching are necessary.

Moreover, since the electrode having the function of assisting the writing and erasing operations does not exist on the memory functional unit and the device structure is simple, the number of processes decreases, so that the yield in production can be increased. Therefore, it facilitates formation with a transistor as a component of a logic circuit or an analog circuit, and a cheap semiconductor memory device can be obtained.

The present invention is more useful in the case where not only the requirements (3) and (9) but also the requirement (6) are satisfied.

Specifically, by overlapping the charge retaining region in the memory functional unit and the diffusion region, writing and erasing can be performed with a very low voltage. Concretely, with a low voltage of 5 V or less, the writing and erasing operations can be performed. The action is a very large effect also from the viewpoint of circuit designing. Since it is unnecessary to generate a high voltage in a chip unlike a flash memory, a charge pumping circuit requiring a large occupation area can be omitted or its scale can be reduced. Particularly, when a memory of small-scale capacity is provided for adjustment in a logic LSI, as for an occupied area in a memory part, an occupation area of peripheral circuits for driving a memory cell is dominant more than that of a memory cell. Consequently, omission or down sizing of the charge pumping circuit for a memory cell is most effective to reduce the chip size.

On the other hand, in the case where the requirement (3) is not satisfied, that is, in the case where a conductor retains charges in the memory functional unit, even when the requirement (6) is not satisfied, specifically, even when the conductor in the memory functional unit and the diffusion region do not overlap with each other, writing operation can be performed. This is because that the conductor in the memory functional unit assists writing operation by capacitive coupling with the gate electrode.

In the case where the requirement (9) is not satisfied, specifically, in the case where the electrode having the function of assisting the writing and erasing operations exists on the memory functional unit, even when the requirement (6) is not satisfied, specifically, even when the insulator in the memory functional unit and the diffusion region do not overlap with each other, writing operation can be performed.

The semiconductor memory device of the present invention may be mounted on the same chip with a logic transistor. In such a case, the semiconductor device of the present invention, particularly, the memory cell can be formed by a process having high compatibility with a process of forming a normal standard transistor such as a transistor or a logic transistor, they can be formed simultaneously. Therefore, a process of forming both the memory cell and a transistor or a logic transistor is very simple and, as a result, a cheap embedded device can be obtained.

In the semiconductor memory device of the present invention, the memory cell can store information of two or more values in one memory functional unit. Thus, the memory cell can function as a memory cell for storing information of four or more values. The memory cell may store binary data only. The memory cell is also allowed to function as a memory cell having the functions of both a selection transistor and a memory transistor by a variable resistance effect of the memory functional unit.

The semiconductor memory device of the present invention can be widely applied by being combined with a logic device, a logic circuit or the like to a display and an electronic apparatus. The semiconductor memory device can be used for a portable electronic apparatus driven by a battery, particularly, a portable information terminal. Examples of the portable electronic apparatus include a portable information terminal, a portable telephone, a game apparatus and the like.

DESCRIPTION OF THE EMBODIMENTS

Hereinafter, embodiments of a semiconductor memory device, a display driver, a display and a portable electronic apparatus according to the present invention will be described in detail with reference to the drawings.

First Embodiment

A semiconductor memory device of a first embodiment has a memory cell 1 as shown in FIG. 1.

The memory cell 1 has a gate electrode 104 formed on a P-type well region 102 formed on the surface of a semiconductor substrate 101 via a gate insulating film 103. On the top face and side faces of the gate electrode 104, a silicon nitride film 109 having a trap level of retaining charges and serving as a charge retaining film is disposed. In the silicon nitride film 109, parts of both sidewalls of the gate electrode 104 serve as memory functional units 105*a* and 105*b* for actually retaining charges. The memory functional unit refers to a part in which charges are actually accumulated by rewriting operation in the memory functional unit or the charge retaining film. In the P-type well region 102 on both sides of the gate electrode 104, N-type diffusion regions 107*a* and 107*b* functioning as a source region and a drain region, respectively, are formed. Each of the diffusion regions 107*a* and 107*b* has an offset structure. Specifically, the diffusion regions 107*a* and 107*b* do not reach a region 121 below the gate electrode 104, and offset regions 120 below the charge retaining film construct part of the channel region.

Figure 2A:
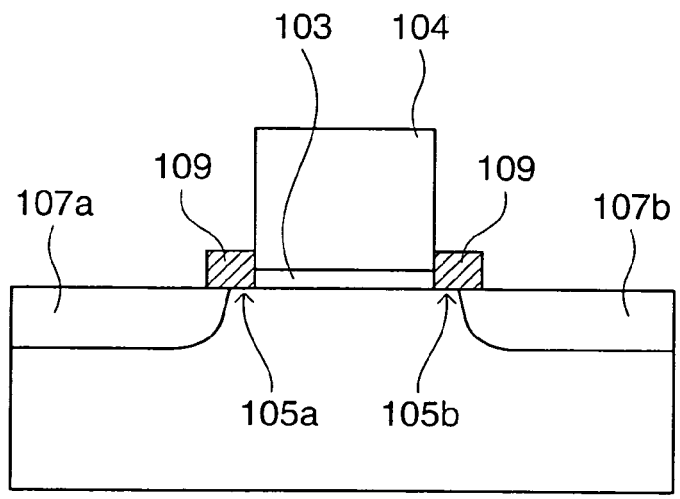
FIGS. 2A and 2B are schematic sectional views, each showing a main part of a modification of the memory cell (first embodiment) constituting the nonvolatile memory part in the display driver according to the present invention.
Figure 2B:
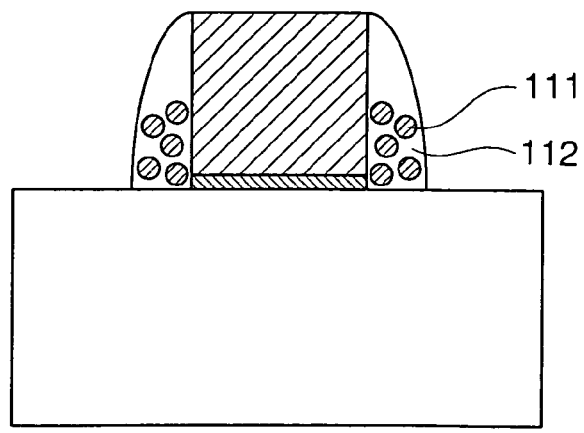

The memory functional units 105*a* and 105*b* for substantially retaining charges are the parts on both sidewalls of the gate electrode 104. It is therefore sufficient that the silicon nitride film 109 is formed only in regions corresponding to the parts (see FIG. 2A). Each of the memory functional units 105*a* and 105*b* may have a structure in which fine particles 111 each made of a conductor or semiconductor and having a nanometer size are distributed like discrete points in an insulating film 112 (see FIG. 2B). When the fine particle 111 has a size less than 1 nm, a quantum effect is too large, so that it becomes hard for charges to go through the dots. When the size exceeds 10 nm, a conspicuous quantum effect does not appear at room temperature. Therefore, the diameter of the fine particle 111 is preferably in a range from 1 nm to 10 nm. The silicon nitride film 109 serving as a charge retaining film may be formed in a sidewall spacer shape on a side face of the gate electrode (see FIG. 3).

The principle of the writing operation of the memory cell will be described with reference to FIGS. 3 and 4. The case where whole memory functional units 131*a* and 131*b* have the function of retaining charges will be described. "Writing" denotes herein injection of electrons into the memory functional units 131*a* and 131*b* when the memory cell is of the N channel type. Hereinafter, on assumption that the memory cell is of the N channel type, description will be given.

Figure 3:
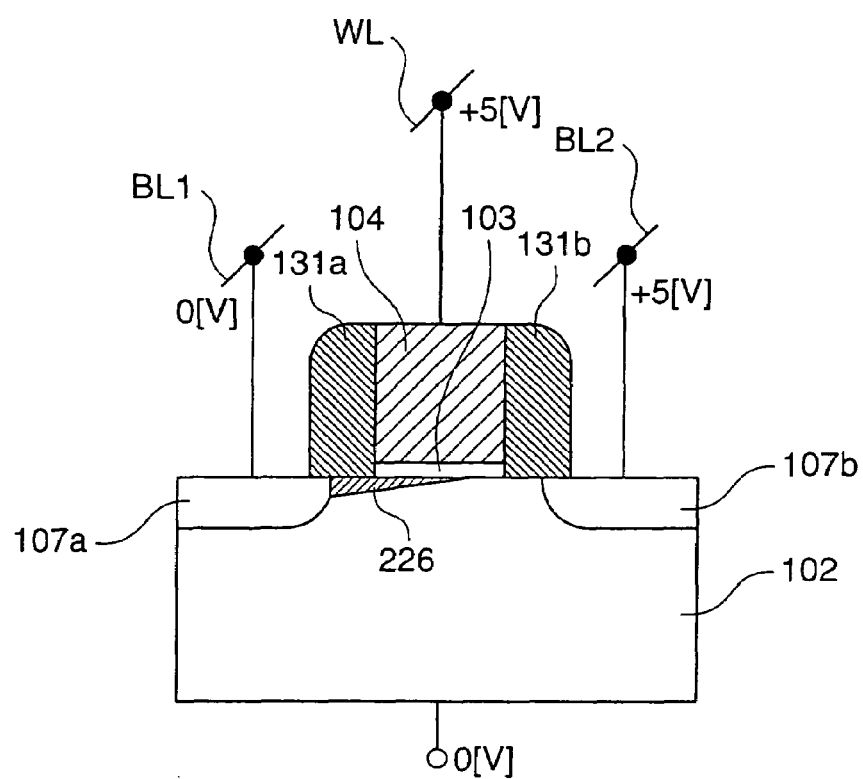
FIG. 3 is a diagram for describing a writing operation of the memory cell (first embodiment) constituting the nonvolatile memory part in the display driver according to the present invention.

In order to inject electrons (write) the second memory functional unit 131*b*, as shown in FIG. 3, the first diffusion region 107*a* of the N type is set as a source electrode, and the second diffusion region 107*b* of the N type is set as a drain electrode. For example, 0 V is applied to the first diffusion region 107*a* and the P-type well region 102, +5 V is applied to the second diffusion region 107*b*, and +5 V is applied to the gate electrode 104. Under such voltage parameters, an inversion layer 226 extends from the first diffusion region 107*a* (source electrode) but does not reach the second diffusion region 107*b* (drain electrode), and a pinch off point occurs. Electrons are accelerated from the pinch-off point to the second diffusion region 107*b* (drain electrode) by a high electric field, and become so-called hot electrons (high-energy conduction electrons). By injection of the hot electrons into the second memory functional unit 131*b*, writing is performed. Since hot electrons are not generated in the vicinity of the first memory functional unit 131*a*, writing is not performed.

Figure 4:
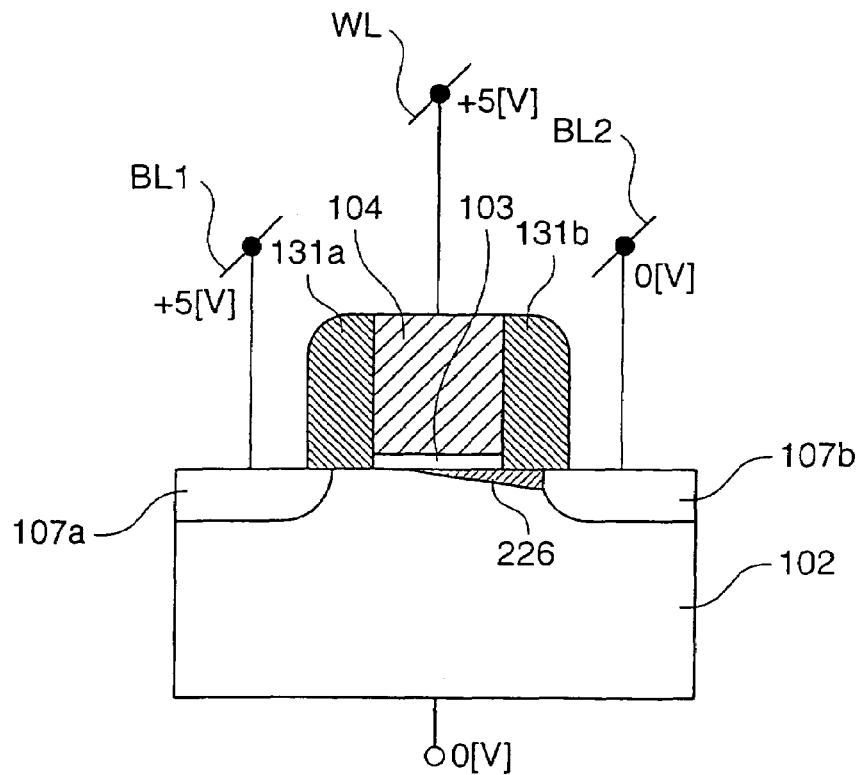
FIG. 4 is a diagram for describing a writing operation of the memory cell (first embodiment) constituting the nonvolatile memory part in the display driver according to the present invention.

On the other hand, in order to inject electrons (write) into the first memory functional unit 131*a*, as shown in FIG. 4, the second diffusion region 107*a* is set as the source electrode, and the first diffusion region 107*a* is set as the drain electrode. For example, 0 V is applied to the second diffusion region 107*b* and the P-type well region 102, +5 V is applied to the first diffusion region 107*a*, and +5 V is applied to the gate electrode 104. By interchanging the source and drain regions so as to be different from the case of injecting electrons into the second memory functional unit 131*b*, electrons are injected into the first memory functional unit 131*a* and writing can be performed.

The principle of erasing operation of the memory cell will now be described with reference to FIGS. 5 and 6.

Figure 5:
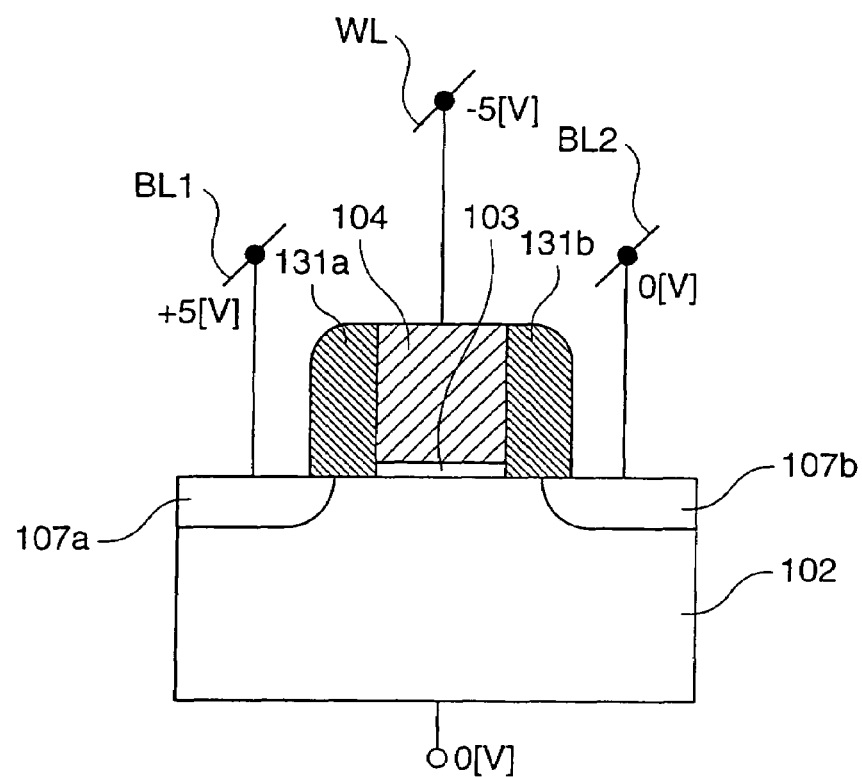
FIG. 5 is a diagram for describing an erasing operation of the memory cell (first embodiment) constituting the nonvolatile memory part in the display driver according to the present invention.

In a first method of erasing information stored in the first memory functional unit 131*a*, by applying positive voltage (for example, +5 V) to the first diffusion region 107*a* and applying 0 V to the P-type well region 102 as shown in FIG. 5, the PN junction between the first diffusion region 107*a* and the P-type well region 102 is reverse-biased and, further, negative voltage (for example, −5 V) is applied to the gate electrode 104. At this time, in the vicinity of the gate electrode 104 in the PN junction, due to the influence of the gate electrode to which the negative voltage is applied, particularly, gradient of potential becomes sharp. Consequently, hot holes (positive holes of high energy) are generated on the side of the P-type well region 102 of the PN junction by interband tunneling. The hot holes are attracted toward the gate electrode 104 having a negative potential and, as a result, the holes are injected to the first memory functional unit 131a. In such a manner, information in the first memory functional unit 131a is erased. At this time, to the second diffusion region 107b, it is sufficient to apply 0 V.

In the case of erasing information stored in the second memory functional unit 131b, the above-described operation is performed while interchanging the potential of the first diffusion region and that of the second diffusion region.

Figure 6:
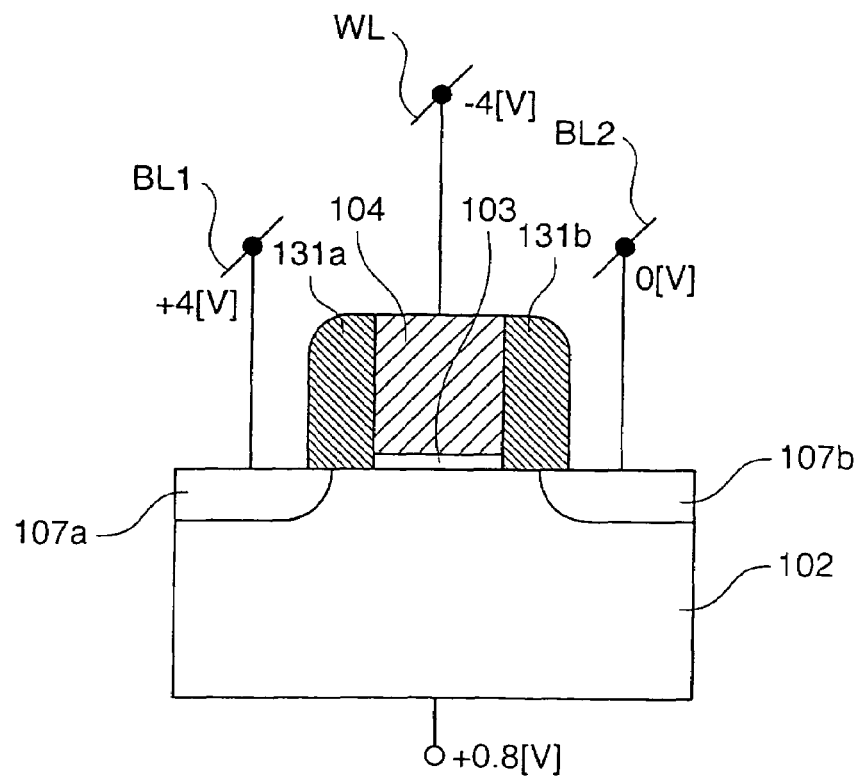
FIG. 6 is a diagram for describing an erasing operation of the memory cell (first embodiment) constituting the nonvolatile memory part in the display driver according to the present invention.

In a second method of erasing information stored in the first memory functional unit 131a, as shown in FIG. 6, positive voltage (for example, +4 V) is applied to the first diffusion region 107a, 0 V is applied to the second diffusion region 107b, negative voltage (for example, −4 V) is applied to the gate electrode 104, and positive voltage (for example, +0.8 V) is applied to the P-type well region 102. At this time, forward voltage is applied between the P-type well region 102 and the second diffusion region 107b, and electrons are injected to the P-type well region 102. The injected electrons are diffused to the PN junction between the P-type well region 102 and the first diffusion region 107a, where the electrons are accelerated by a strong electric field, thereby becoming hot electrons. By the hot electrons, an electron-hole pair is generated in the PN junction. Specifically, by applying forward voltage between the P-type well region 102 and the second diffusion region 107b, electrons injected in the P-type well region 102 become a trigger, and hot holes are generated in the PN junction positioned on the opposite side. The hot holes generated in the PN junction are attracted toward the gate electrode 104 having the negative potential and, as a result, positive holes are injected into the first memory functional unit 131a.

According to the method, also in the case where only voltage insufficient to generate hot holes by interband tunneling is applied to the PN junction between the P-type well region and the first diffusion region 107a, electrons injected from the second diffusion region 107b become a trigger to generate an electron-positive hole pair in the PN junction, thereby enabling hot holes to be generated. Therefore, voltage in the erasing operation can be decreased. Particularly, in the case where the offset region 120 (see FIG. 1) exists, an effect that the gradient of potential in the PN junction becomes sharp by the gate electrode to which the negative potential is applied is low. Consequently, although it is difficult to generate hot holes by interband tunneling, by the second method, the disadvantage is overcome and the erasing operation can realized with low voltage.

In the case of erasing information stored in the first memory functional unit 131a, +5 V has to be applied to the first diffusion region 107a in the first erasing method whereas +4 V is sufficient in the second erasing method. As described above, according to the second method, the voltage at the time of erasing can be decreased, so that power consumption can be reduced and deterioration of the memory cell due to hot carriers can be suppressed.

In any of the erasing methods, over-erasure does not occur easily in the memory cell. The over-erasure herein denotes a phenomenon that as the amount of positive holes accumulated in the memory functional unit increases, the threshold decreases without saturation. The over-erasure is a big issue in an EEPROM typified by a flash memory. Particularly, in the case where the threshold becomes negative, critical malfunctioning that selection of a memory cell becomes impossible occurs. On the other hand, in the memory cell in the semiconductor memory device of the present invention, also in the case where a large amount of positive holes are accumulated in the memory functional unit, only electrons are induced below the memory functional unit but an influence is hardly exerted to the potential in the channel region below the gate insulating film. Since the threshold at the time of erasing is determined by the potential below the gate insulating film, occurrence of over-erasure is suppressed.

Figure 7:
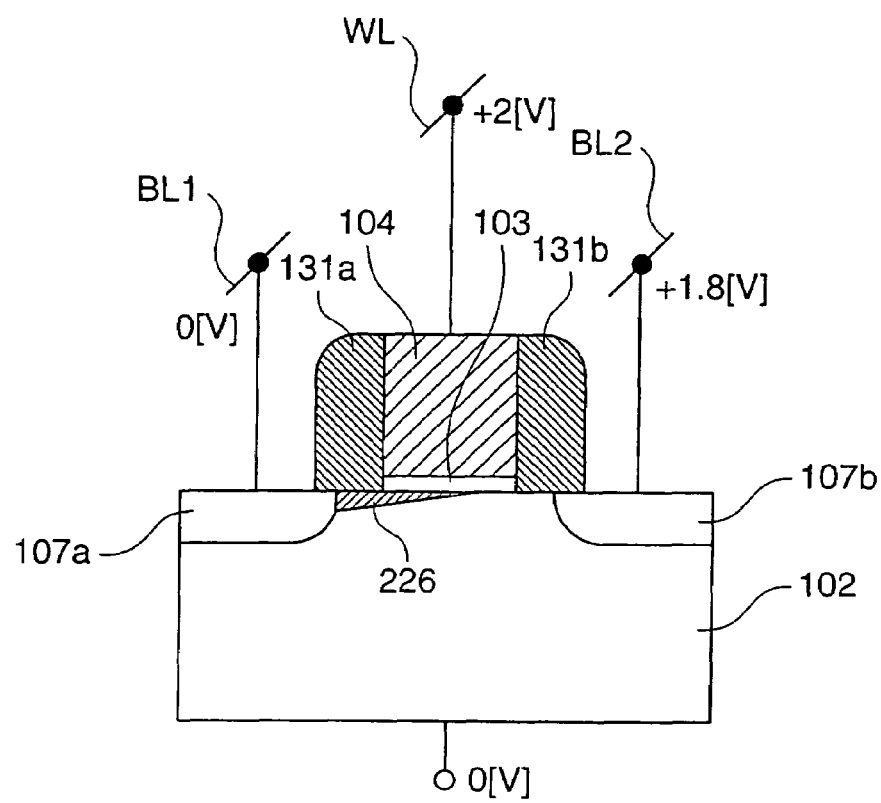
FIG. 7 is a diagram for describing a reading operation of the memory cell (first embodiment) constituting the nonvolatile memory part in the display driver according to the present invention.

Further, the principle of reading operation of the memory cell will be described with reference to FIG. 7.

In the case of reading information stored in the first memory functional unit 131a, the first diffusion region 107a is set as a source electrode, the second diffusion region 107b is set as a drain electrode, and the transistor is allowed to operate in a saturated region. For example, 0 V is applied to the first diffusion region 107a and the P-type well region 102, +1.8 V is applied to the second diffusion region 107b, and +2 V is applied to the gate electrode 104. In the case where electrons are not accumulated in the first memory functional unit 131a at this time, drain current is apt to flow. On the other hand, in the case where electrons are accumulated in the first memory functional unit 131a, an inversion layer is not easily formed in the vicinity of the first memory functional unit 131a, so that the drain current is not apt to flow. Therefore, by detecting the drain current, information stored in the first memory functional unit 131a can be read. The presence/absence of charge accumulation in the second memory functional unit 131b does not exert an influence on the drain current since the pinch-off point occurs in the area in the vicinity of the drain.

In the case of reading information stored in the second memory functional unit 131b, the second diffusion region 107b is set as a source electrode, the first diffusion region 107a is set as a drain electrode, and the transistor is operated in a saturated region. It is sufficient to apply, for example, 0V to the second diffusion region 107b and the P-type well region 102, +1.8 V to the first diffusion region 107a, and +2 V to the gate electrode 104. By interchanging the source and drain regions of the case of reading information stored in the first memory functional unit 131a, information stored in the second memory functional unit 131b can be read.

In the case where a channel region (offset region 120) which is not covered with the gate electrode 104 remains, in the channel region which is not covered with the gate electrode 104, an inversion layer is dissipated or formed according to the presence/absence of excessive charges in the memory functional units 131a and 131b and, as a result, large hysteresis (change in the threshold) is obtained. However, when the offset region 120 is too wide, the drain current largely decreases and reading speed becomes much slower. Therefore, it is preferable to determine the width of the offset region 120 so as to obtain sufficient hysteresis and reading speed.

Also in the case where the diffusion regions 107a and 107b reach ends of the gate electrode 104, that is, the diffusion regions 107a and 107b overlap with the gate electrode 104, the threshold of the transistor hardly changes by the writing operation. However, parasitic resistance at the source/drain ends largely changes, and the drain current largely decreases (by equal to or more than one digit). Therefore, reading can be performed by detecting the drain current, and the function as a memory can be obtained. In the case where a larger memory hysteresis effect is necessary, it is preferable that the diffusion regions 107a and 107b and the gate electrode 104 are not overlapped (offset region 120 exists).

By the above operating method, two bits can be written/ erased selectively per one transistor. By connecting a word line WL to the gate electrode 104 of the memory cell, connecting a first bit line BL1 to the first diffusion region 107a, connecting a second bit line BL2 to the second diffusion region 107b, and arranging memory cells, a memory cell array can be constructed.

In the above-described operating method, by interchanging the source electrode and the drain electrode, writing and erasing of two bits per one transistor are performed. Alternatively, by fixing the source electrode and the drain electrode, the transistor may operate as a 1-bit memory. In this case, common fixed voltage can be applied to one of the source and drain regions, so that the number of bit lines connected to the source/drain regions can be reduced to the half.

As obvious from the above description, in the memory cell in the semiconductor memory device of the present invention, the memory functional unit is formed independently of the gate insulating film, and is formed on both sides of the gate electrode, so that 2-bit operation is possible. Since each memory functional unit is isolated by the gate electrode, interference at the time of rewriting is effectively suppressed. Further, since the gate insulating film is isolated from the memory functional unit, it can be formed thinly and a short channel effect can be suppressed. Therefore, reduction in size of the memory cell and, accordingly, the semiconductor memory device can be achieved easily.

Second Embodiment

Figure 8:
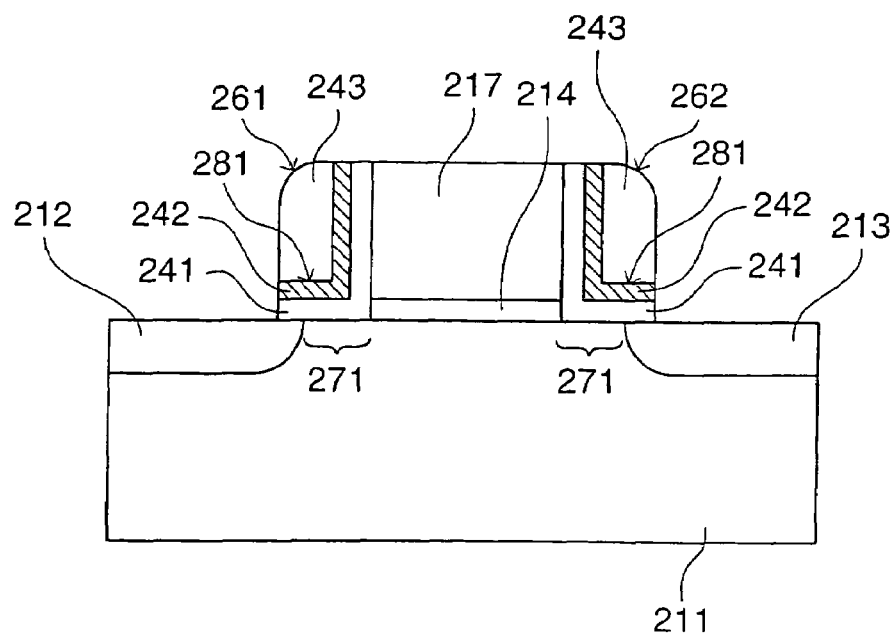
FIG. 8 is a schematic sectional view showing a main part of a memory cell (second embodiment) constituting the nonvolatile memory part in the display driver according to the present invention.

A memory cell in a semiconductor memory device according to a second embodiment has a configuration substantially similar to that of the memory cell 1 of FIG. 1 except that, as shown in FIG. 8, each of memory functional units 261 and 262 is constructed by a charge retaining region (which is a charge accumulating region and may be a film having the function of retaining charges) and a region for suppressing escape of charges (or a film having the function of suppressing escape of charges).

From the viewpoint of improving a memory retention characteristic, preferably, the memory functional unit includes a charge retaining film having the function of retaining charges and an insulating film. In the second embodiment, a silicon nitride film 242 having a level of trapping charges is used as the charge retaining film, and silicon oxide films 241 and 243 having the function of preventing dissipation of charges accumulated in the charge retaining are used as insulating films. The memory functional unit includes the charge retaining film and the insulating films, thereby preventing dissipation of charges, and the retention characteristic can be improved. As compared with the case where the memory functional unit is constructed only by the charge retaining film, the volume of the charge retaining film can be appropriately reduced, movement of charges in the charge retaining film is regulated, and occurrence of a characteristic change due to charge movement during retention of information can be suppressed. Further, by employing the structure in which the silicon nitride film 242 is sandwiched by the silicon oxide films 241 and 243, charge injecting efficiency at the time of rewriting operation becomes high, so that higher-speed operation can be performed. In the memory cell, the silicon nitride film 242 may be replaced with a ferroelectric.

The regions for retaining charges (silicon nitride films 242) in the memory functional units 261 and 262 overlap with diffusion regions 212 and 213. The overlap denotes herein that at least a part of the region for retaining charges (silicon nitride film 242) exists over at least a part of the diffusion regions 212 and 213. A reference numeral 211 denotes a semiconductor substrate, a reference numeral 214 denotes a gate insulating film, a reference numeral 217 denotes a gate electrode, and a reference numeral 271 indicates an offset region between the gate electrode 217 and the diffusion regions 212 and 213. Although not shown, the surface of the semiconductor substrate 211 under the gate insulating film 214 serves as a channel region.

An effect obtained when the silicon nitride films 242 as regions for retaining charges in the memory functional units 261 and 262 overlap with the diffusion regions 212 and 213 will be described.

Figure 9:
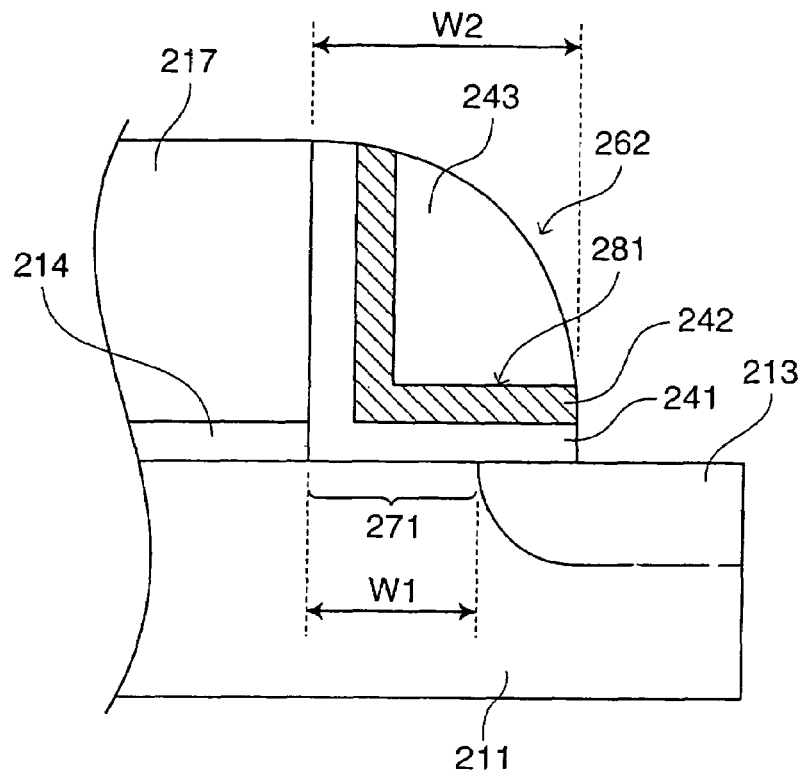
FIG. 9 is an enlarged schematic sectional view showing the main part of FIG. 8.

As shown in FIG. 9, in an area around the memory functional unit 262, when an offset amount between the gate electrode 217 and the diffusion region 213 is W1 and the width of the memory functional unit 262 in a cross section in the channel length direction of the gate electrode is W2, the overlap amount between the memory functional unit 262 and the diffusion region 213 is expressed as W2−W1. It is important herein that the memory functional unit 262 constructed by the silicon oxide film 242 in the memory functional unit 262 overlaps with the diffusion region 213, that is, the relation of W2>W1 is satisfied.

In FIG. 9, an end on the side apart from the gate electrode 217 of the silicon nitride film 242 in the memory functional unit 262 matches with the end of the memory functional unit 262 on the side apart from the gate electrode 217, so that the width of the memory functional unit 262 is defined as W2.

Figure 10:
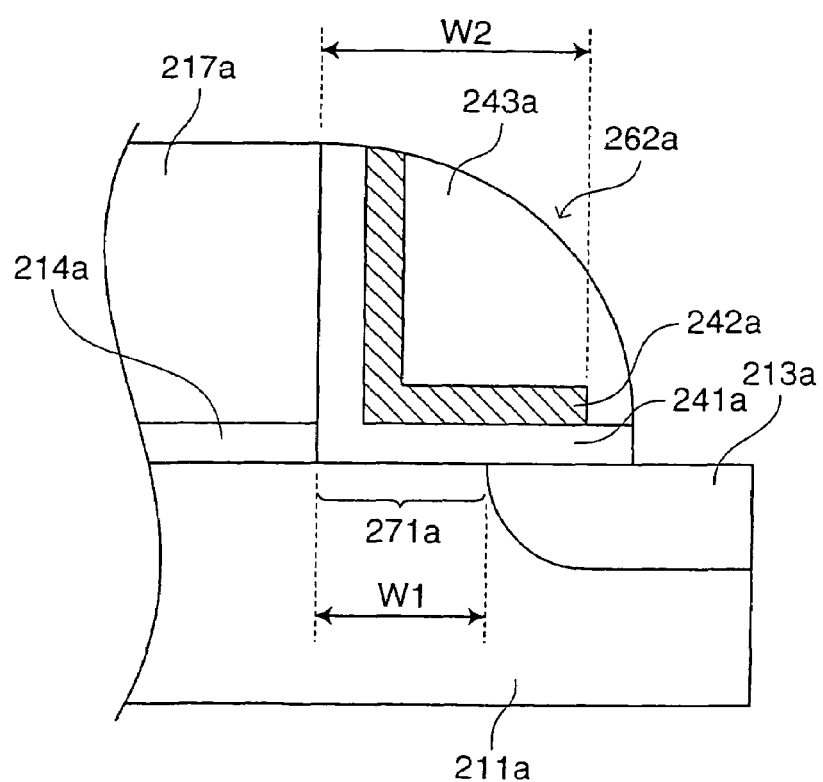
FIG. 10 is an enlarged schematic sectional view showing a modification of the main part of FIG. 8.

As shown in FIG. 10, when the end on the side apart from the gate electrode of a silicon nitride film 242a in a memory functional unit 262a does not match with the end of the memory functional unit 262a on the side apart from the gate electrode, W2 may be defined as a distance from the gate electrode end to an end on the side apart from the gate electrode of the silicon nitride film 242a.

Figure 11:
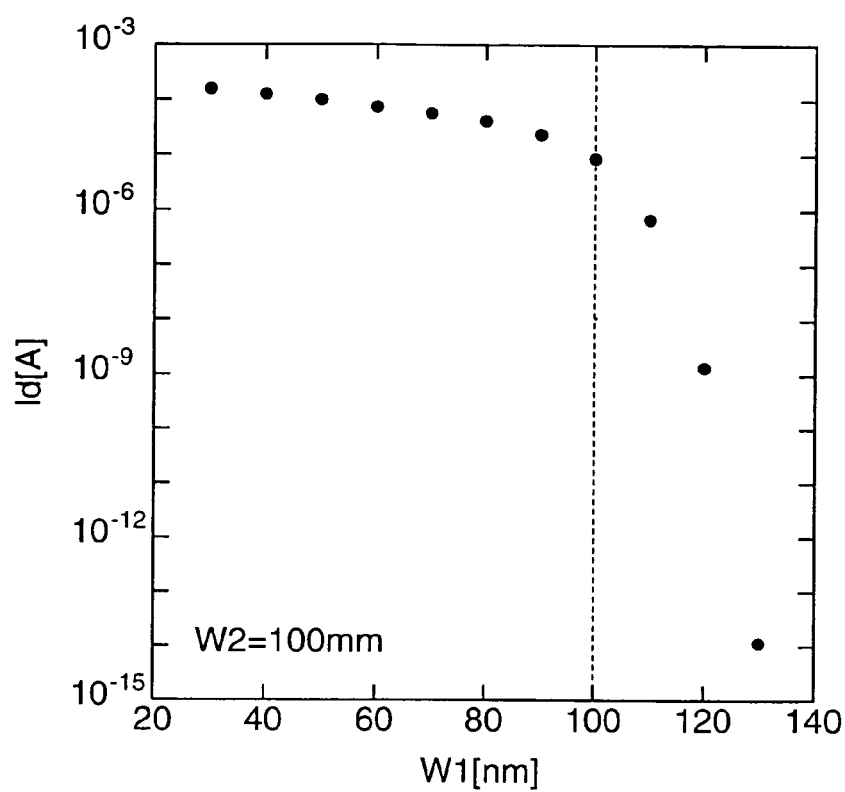
FIG. 11 is a graph showing electric characteristics of the memory cell (second embodiment) constituting the nonvolatile memory part in the display driver according to the present invention.

FIG. 11 shows drain current Id when the width W2 of the memory functional unit 262 is fixed to 100 nm and the offset amount W1 is changed in the structure of the memory cell of FIG. 9. Herein, the drain current was obtained by device simulation on assumption that the memory functional unit 262 is in erasing state (holes are accumulated), and the diffusion regions 212 and 213 serve as the source electrode and the drain electrode, respectively.

As obvious from FIG. 11, in the range where W1 is 100 nm or more (that is, the silicon nitride film 242 and the diffusion region 213 do not overlap with each other), the drain current sharply decreases. Since the drain current value is almost proportional to the reading operation speed, the performance of the memory sharply deteriorates with W1 of 100 nm or more. On the other hand, in the range where the silicon nitride film 242 and the diffusion region 213 overlap with each other, decrease in the drain current is gentle. Therefore, in the case of considering also variations in mass production, if at least a part of the silicon nitride film 242 as the film having the function of retaining charges does not overlap with the source and drain regions, it is difficult to obtain the memory function in reality.

On the basis of the result of the device simulation, by fixing W2 to 100 nm and setting W1 to 60 nm and 100 nm as design values, memory cell arrays were produced. In the case where W1 is 60 nm, the silicon nitride film 242 and the diffusion regions 212 and 213 overlap with each other by 40 nm as a design value. In the case where W1 is 100 nm, there is no overlap as a design value. Reading time of the memory cell arrays was measured and worst cases considering variations were compared with each other. In the where W1 is set to 60 nm as a design value, read access time is 100 times as fast as that of the other case. In practice, the read access time is preferably 100 n/sec or less per one bit. When W1=W2, the condition cannot be achieved. In the case of considering manufacture variations as well, it is more preferable that (W2−W1)>10 nm.

To read information stored in the memory functional unit 261 (region 281), in a manner similar to the first embodiment, it is preferable to set the diffusion region 212 as a source electrode, set the diffusion region 213 as a drain region, and form a pinch-off point on the side closer to the drain region in the channel region. Specifically, at the time of reading information stored in one of the two memory functional units, it is preferable to form the pinch-off point in a region closer to the other memory functional unit, in the channel region. With the arrangement, irrespective of a storage state of the memory functional unit 262, information stored in the memory functional unit 261 can be detected with high sensitivity, and it is a large factor to achieve 2-bit operation.

On the other hand, in the case of storing information only one of two memory functional units or in the case of using the two memory functional units in the same storage state, it is not always necessary to form the pinch-off point at the time of reading.

Although not shown in FIG. 8, it is preferable to form a well region (P-type well in the case of the N channel device) in the surface of the semiconductor substrate 211. By forming the well region, it becomes easy to control the other electric characteristics (withstand voltage, junction capacitance and short-channel effect) while setting the impurity concentration in the channel region optimum to the memory operations (rewriting operation and reading operation).

Figure 12:
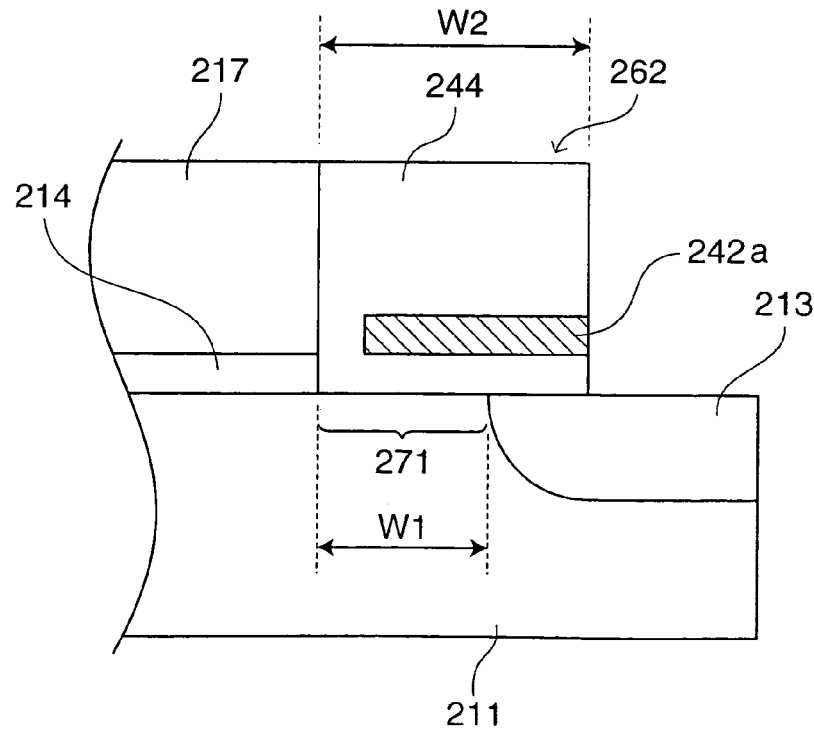
FIG. 12 is a schematic sectional view showing a main part of a modification of the memory cell (second embodiment) constituting the nonvolatile memory part in the display driver according to the present invention.

The memory functional unit preferably includes the charge retaining film disposed almost in parallel with the gate insulating film surface. In other words, it is preferable that the level of the top face of the charge retaining film in the memory functional unit is positioned parallel to the level of the top face of the gate insulating film 214. Concretely, as shown in FIG. 12, the silicon nitride film 242a as a charge retaining film of the memory functional unit 262 has a surface almost parallel with the surface of the gate insulating film 214. In other words, it is preferable that the silicon nitride film 242a is formed at a level parallel to the level corresponding to the surface of the gate insulating film 214.

By the existence of the silicon nitride film 242a almost parallel to the surface of the gate insulating film 214 in the memory functional unit 262, formation easiness of the inversion layer in the offset region 271 can be effectively controlled in accordance with an amount of charges accumulated in the silicon nitride film 242a. Thus, the memory effect can be increased. By forming the silicon nitride film 242a almost in parallel with the surface of the gate insulating film 214, even in the case where the offset amount (W1) varies, a change in the memory effect can be maintained relatively small, and variations of the memory effect can be suppressed. Moreover, movement of the charges upward in the silicon nitride film 242a is suppressed, and occurrence of a characteristic change due to the charge movement during retention of information can be suppressed.

Preferably, the memory functional unit 262 includes an insulating film (for example, portion on the offset region 271 in the silicon oxide film 244) for separating the silicon nitride film 242a which is almost parallel to the surface of the gate insulating film 214 and the channel region (or well region). By the insulating film, dissipation of the charges accumulated in the charge retaining film is suppressed and a memory cell having a better retention characteristic can be obtained.

By controlling the thickness of the silicon nitride film 242a and controlling the thickness of the insulating film below the silicon nitride film 242a (portion on the offset region 271 in the silicon oxide film 244) to be constant, the distance from the surface of the semiconductor substrate to charges accumulated in the charge retaining film can be maintained almost constant. To be specific, the distance from the surface of the semiconductor substrate to the charges accumulated in the charge retaining film can be controlled in a range from the minimum thickness value of the insulating film under the silicon nitride film 242a to the sum of the maximum thickness value of the insulating film under the silicon nitride film 242a and the maximum thickness value of the silicon nitride film 242a. Consequently, density of electric lines of force generated by the charges accumulated in the silicon nitride film 242a can be almost controlled, and variations in the memory effect of the memory cell can be reduced very much.

Third Embodiment

Figure 13:
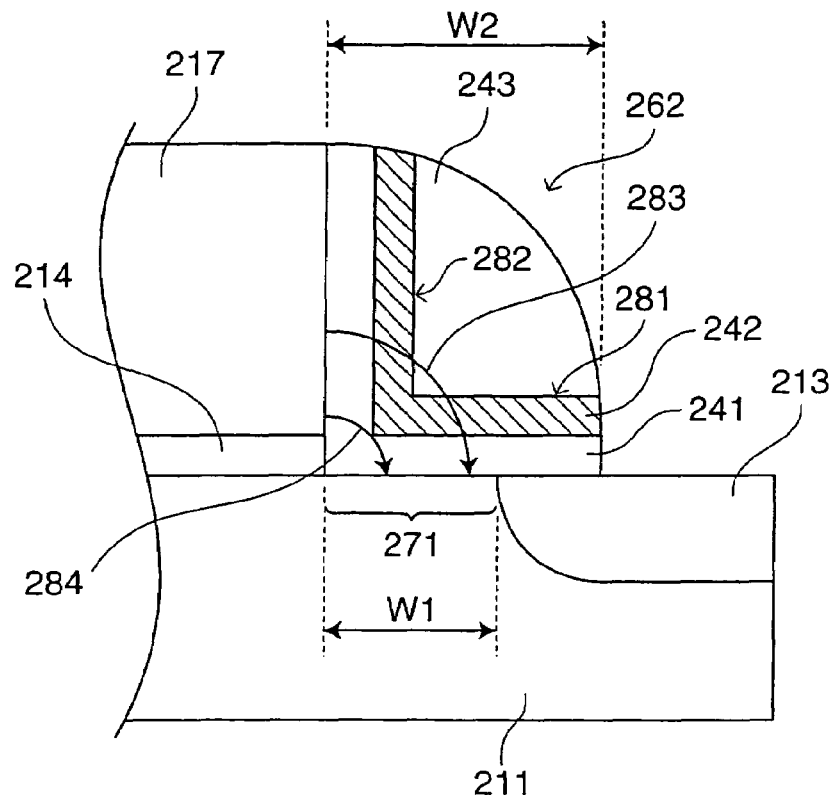
FIG. 13 is a schematic sectional view showing a main part of a memory cell (third embodiment) constituting the nonvolatile memory part in the display driver according to the present invention.

The memory functional unit 262 in a semiconductor memory device of a third embodiment has a shape in which the silicon nitride film 242 as a charge retaining film has almost uniform thickness and is disposed almost in parallel with the surface of the gate insulating film 214 as shown in FIG. 13 (region 281) and, further, almost in parallel with a side face of the gate electrode 217 (region 282).

In the case where positive voltage is applied to the gate electrode 217, an electric line 283 of force in the memory functional unit 262 passes the silicon nitride film 242 twice (regions 282 and 281) as shown by an arrow. When negative voltage is applied to the gate electrode 217, the direction of the electric line of force becomes opposite. Herein, the dielectric constant of the silicon nitride film 242 is about 6, and that of silicon oxide films 241 and 243 is about 4. Therefore, effective dielectric constant of the memory functional unit 262 in the direction of the electric line 283 of force is higher and the potential difference at both ends of the electric line of force can be reduced more as compared with the case where only the region 281 of the charge retaining film exists. In other words, a large part of the voltage applied to the gate electrode 217 is used to enhance the electric field in the offset region 271.

The reason why charges are injected to the silicon nitride film 242 in the rewriting operation is because generated charges are attracted by the electric field in the offset region 271. Therefore, by including the charge retaining film shown by the arrow 282, charges injected into the memory functional unit 262 increase in the rewriting operation, and the rewriting speed increases.

In the case where the portion of the silicon oxide film 243 is also the silicon nitride film, that is, in the case where the level of the charge retaining film is not parallel with the level corresponding to the surface of the gate insulating film 214, upward movement of charges in the silicon nitride film becomes conspicuous, and the retention characteristic deteriorates.

More preferably, in place of the silicon nitride film, the charge retaining film is made of a high dielectric such as hafnium oxide having a very high dielectric constant.

It is preferable that the memory functional unit further includes an insulating film (portion on the offset region 271 in the silicon oxide film 241) for separating the charge retaining film almost parallel to the surface of the gate insulating film and the channel region (or well region). By the insulating film, dissipation of charges accumulated in the charge retaining film is suppressed, and the retention characteristic can be further improved.

Preferably, the memory functional unit further includes an insulating film (portion in contact with the gate electrode 217 in the silicon oxide film 241) for separating the gate electrode and the charge retaining film extended almost parallel with the side face of the gate electrode. The insulating film prevents injection of charges from the gate electrode into the charge retaining film and accordingly prevents a change in the electric characteristics. Thus, the reliability of the memory cell can be improved.

Further, in a manner similar to the second embodiment, it is preferable to control the thickness of the insulating film under the silicon nitride film 242 (portion on the offset region 271 in the silicon oxide film 241) to be constant and to control the thickness of the insulating film on the side face of the gate electrode (portion in contact with the gate electrode 217 in the silicon oxide film 241) to be constant. Consequently, the density of the electric lines of force generated by the charges accumulated in the silicon nitride film 242 can be almost controlled, and charge leak can be prevented.

Fourth Embodiment

In a fourth embodiment, optimization of the gate electrode, the memory functional unit, and the distance between the source and drain regions of a memory cell in a semiconductor memory device will be described.

Figure 14:
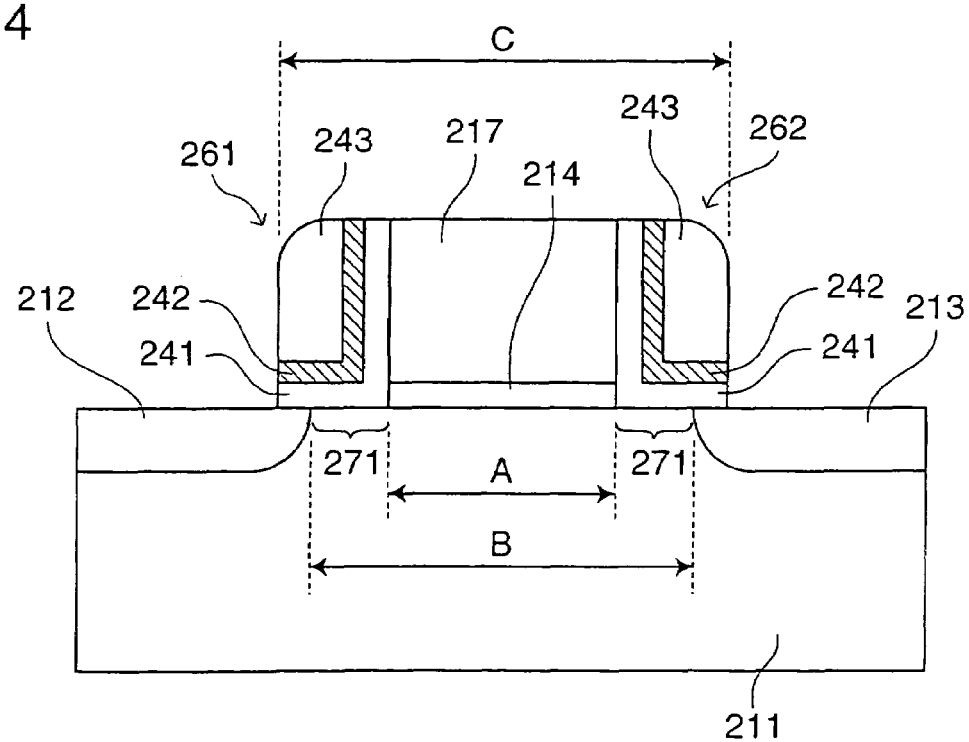
FIG. 14 is a schematic sectional view showing a main part of a memory cell (fourth embodiment) constituting the nonvolatile memory part in the display driver according to the present invention.

As shown in FIG. 14, a reference character A denotes length of the gate electrode in a cut surface in the channel length direction, a reference character B denotes the distance between the source and drain regions (channel length), and a reference character C denotes the distance from the end of one of memory functional units to the end of the other memory functional unit, that is, the distance between the end (on the side far from the gate electrode) of a film having the function of retaining charges in one of memory functional units to the end (on the side apart from the gate electrode) of a film having the function of retaining charges in the other memory functional unit in a cut surface in the channel length direction.

In such a memory cell, B<C is preferable. By satisfying such a relation, the offset regions 271 exist between the portion under the gate electrode 217 in the channel region and the diffusion regions 212 and 213. Consequently, easiness of inversion effectively fluctuates in the whole offset regions 271 by charges accumulated in the memory functional units 261 and 262 (silicon nitride films 242). Therefore, the memory effect increases and, particularly, higher-speed reading operation is realized.

In the case where the gate electrode 217 and the diffusion regions 212 and 213 are offset from each other, that is, in the case where the relation of A<B is satisfied, easiness of inversion in the offset region when voltage is applied to the gate electrode largely varies according to an amount of charges accumulated in the memory functional unit, so that the memory effect increases, and the short channel effect can be reduced.

However, as long as the memory effect appears, the offset region 271 does not always have to exist. Also in the case where the offset region 271 does not exist, if the impurity concentration in the diffusion regions 212 and 213 is sufficiently low, the memory effect can be exhibited in the memory functional units 261 and 262 (silicon nitride films 242).

Therefore, A<B<C is the most preferable.

Fifth Embodiment

Figure 15:
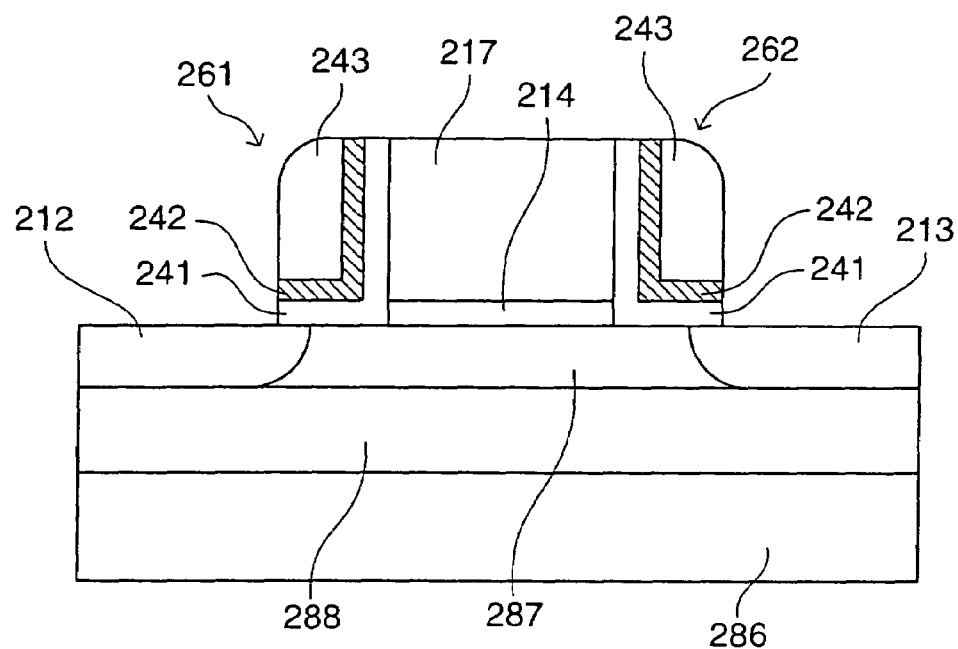
FIG. 15 is a schematic sectional view showing a main part of a memory cell (fifth embodiment) constituting the nonvolatile memory part in the display driver according to the present invention.

A memory cell of a semiconductor memory device in a fifth embodiment has a substantially similar configuration to that of the second embodiment except that an SOI substrate is used as the semiconductor substrate in the second embodiment as shown in FIG. 15.

In the memory cell, a buried oxide film 288 is formed on a semiconductor substrate 286, and an SOI layer is formed on the buried oxide film 288. In the SOI layer, the diffusion regions 212 and 213 are formed and the other region is a body region 287.

By the memory cell as well, action and effect similar to those of the memory cell of the second embodiment are obtained. Further, junction capacitance between the diffusion regions 212 and 213 and the body region 287 can be remarkably reduced, so that higher-speed operation and lower power consumption of the device can be achieved.

Sixth Embodiment

Figure 16:
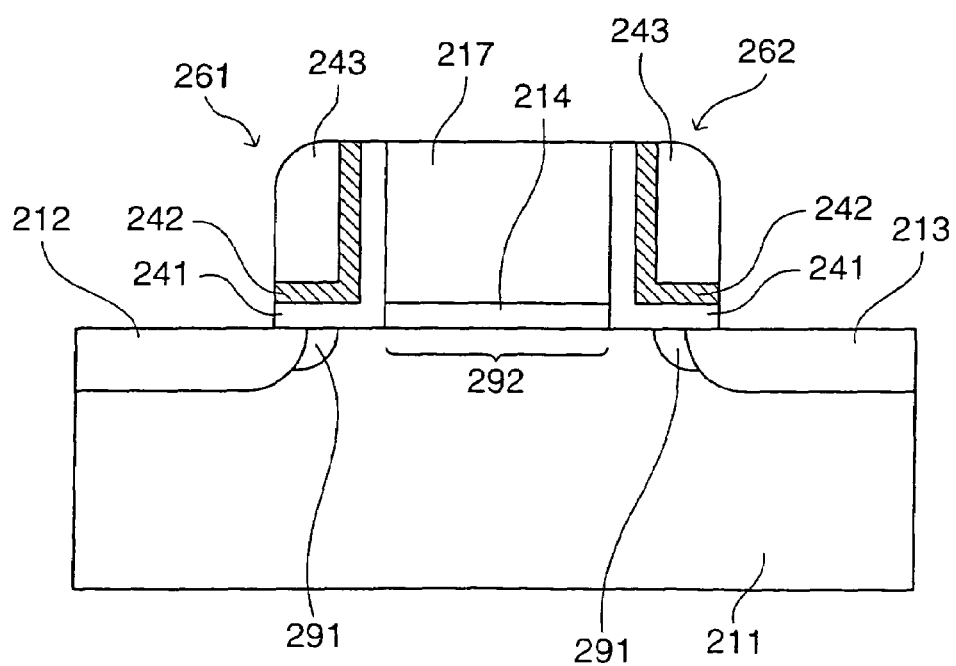
FIG. 16 is a schematic sectional view showing a main part of a memory cell (sixth embodiment) constituting the nonvolatile memory part in the display driver according to the present invention.

A memory cell in a semiconductor memory device in a sixth embodiment has, as shown in FIG. 16, a configuration substantially similar to that of the memory cell of the second embodiment except that a P-type high-concentration region 291 is added adjacent to the channel sides of the N-type diffusion regions 212 and 213.

Specifically, the concentration of a P-type impurity (for example, boron) in the P-type high-concentration region 291 is higher than that of a P-type impurity in a region 292. Suitable P-type impurity concentration in the P-type high-concentration region 291 is, for example, about $5 \times 10^{17}$ to $1 \times 10^{19}$ cm$^{-3}$. The P-type impurity concentration of the region 292 can be set to, for example, $5 \times 10^{16}$ to $1 \times 10^{18}$ cm$^{-3}$.

By providing the P-type high-concentration region 291, the junction between the diffusion regions 212 and 213 and the semiconductor substrate 211 becomes sharp below the memory functional units 261 and 262. Consequently, hot carriers are easily generated in the writing and erasing operations, the voltage of the writing and erasing operations can be decreased or the writing operation and the erasing operation can be performed at high speed. Moreover, since the impurity concentration in the region 292 is relatively low, the threshold when the memory is in the erasing state is low, and the drain current is large. Consequently, the reading speed is improved. Therefore, the memory cell with low rewriting voltage or high rewriting speed and high reading speed can be obtained.

In FIG. 16, by providing the P-type high-concentration region 291 in the vicinity of the source/drain regions and below the memory functional unit (that is, not immediately below the gate electrode), the threshold of the whole transistor remarkably increases. The degree of increase is much higher than that in the case where the P-type high-concentration region 291 is positioned immediately below the gate electrode. In the case where write charges (electrons when the transistor is of the N-channel type) are accumulated in the memory functional unit, the difference becomes larger. On the other hand, in the case where sufficient erasing charges (positive holes when the transistor is of the N-channel type) are accumulated in the memory functional unit, the threshold of the whole transistor decreases to a threshold determined by the impurity concentration in the channel region (region 292) below the gate electrode. That is, the threshold in the erasing operation does not depend on the impurity concentration of the P-type high-concentration region 291 whereas the threshold in the writing operation is largely influenced. Therefore, by disposing the P-type high-concentration region 291 under the memory functional unit and in the vicinity of the source/drain regions, only the threshold in the writing operation largely fluctuates, and the memory effect (the difference between the threshold in the writing operation and that in the erasing operation) can be remarkably increased.

Seventh Embodiment

Figure 17:
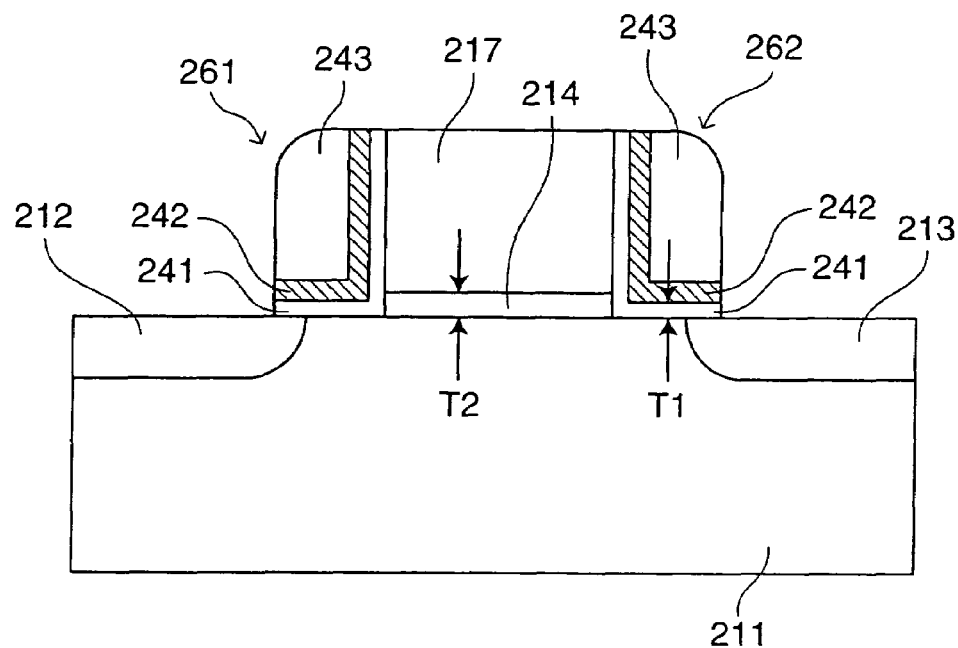
FIG. 17 is a schematic sectional view showing a main part of a memory cell (seventh embodiment) constituting the nonvolatile memory part in the display driver according to the present invention.

A memory cell in a semiconductor memory device of a seventh embodiment has a configuration substantially similar to that of the second embodiment except that, as shown in FIG. 17, the thickness (T1) of an insulating film separating the charge retaining film (silicon nitride film 242) and the channel region or well region is smaller than the thickness (T2) of the gate insulating film.

The thickness T2 of the gate insulating film 214 has the lower limit value from the demand of withstand voltage at the time of rewriting operation of the memory. However, the thickness T1 of the insulating film can be made smaller than T2 irrespective of the demand of withstand voltage.

The flexibility of designing with respect to T1 is high in the memory cell for the following reason.

In the memory cell, the insulating film for separating the charge retaining film and the channel region or well region is not sandwiched by the gate electrode and the channel region or well region. Consequently, to the insulating film for separating the charge retaining film and the channel region or well region, a high electric field acting between the gate electrode and the channel region or well region does not directly act, but a relatively low electric field spreading from the gate electrode in the lateral direction acts. Consequently, irrespective of the demand of withstand voltage to the gate insulating film, T1 can be made smaller than T2.

By making T1 thinner, injection of charges into the memory functional unit becomes easier, the voltage of the writing operation and the erasing operation is decreased or the writing operation and erasing operation can be performed at high speed. Since the amount of charges induced in the channel region or well region when charges are accumulated in the silicon nitride film 242 increases, the memory effect can be increased.

The electric lines of force in the memory functional unit include a short one which does not pass through the silicon nitride film 242 as shown by an arrow 284 in FIG. 13. On the relatively short electric line of force, electric field intensity is relatively high, so that the electric field along the electric line of power plays a big role in the rewriting operation. By reducing T1, the silicon nitride film 242 is positioned downward in the figure, and the electric line of force indicated by the arrow 283 passes through the silicon nitride film. Consequently, the effective dielectric constant in the memory functional unit along the electric line 284 of force increases, and the potential difference at both ends of the electric line of force can be further decreased. Therefore, a large part of the voltage applied to the gate electrode 217 is used to increase the electric field in the offset region, and the writing operation and the erasing operation become faster.

In contrast, for example, in an EEPROM typified by a flash memory, the insulating film separating the floating gate and the channel region or well region is sandwiched by the gate electrode (control gate) and the channel region or well region, so that a high electric field from the gate electrode directly acts. Therefore, in an EEPROM, the thickness of the insulating film separating the floating gate and the channel region or well region is regulated, and optimization of the function of the memory cell is inhibited.

As obvious from the above, by setting T1<T2, without deteriorating the withstand voltage performance of the memory, the voltage of the writing and erasing operations is decreased, or the writing operation and erasing operation are performed at high speed and, further, the memory effect can be increased. More preferably, the thickness T1 of the insulating film is 0.8 nm or more at which uniformity or quality by a manufacturing process can be maintained at a predetermined level and which is the limitation that the retention characteristic does not deteriorate extremely.

Concretely, in the case of a liquid crystal driver LSI requiring high withstand voltage in a design rule, to drive the liquid crystal panel TFT, voltage of 15 to 18 V at the maximum is required, so that the gate oxide film cannot be thinned normally. In the case of mounting a nonvolatile memory for image adjustment on the liquid crystal driver LSI, in the memory cell of the present invention, the thickness of the insulating film separating the charge retaining film (silicon nitride film 242) and the channel region or well region can be designed optimally independently of the thickness of the gate insulating film. For example, the thickness can be individually set as T1=20 nm and T2=10 nm for a memory cell having a gate electrode length (word line width) of 250 nm, so that a memory cell having high writing efficiency can be realized (the reason why the short channel effect is not produced when T1 is larger than the thickness of a normal logic transistor is because the source and drain regions are offset from the gate electrode).

Eighth Embodiment

Figure 18:
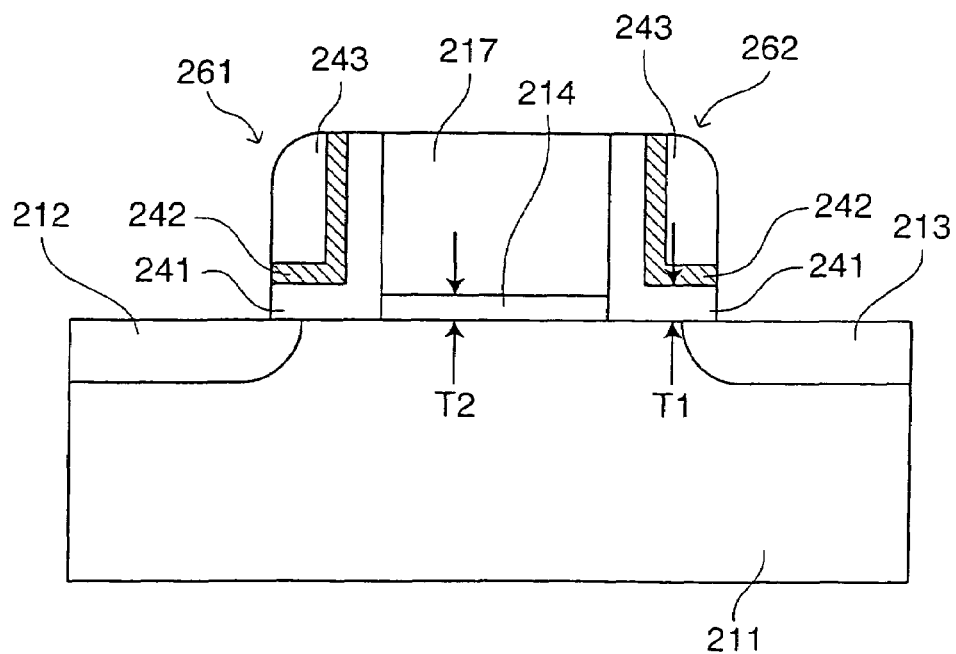
FIG. 18 is a schematic sectional view showing a main part of a memory cell (eighth embodiment) constituting the nonvolatile memory part in the display driver according to the present invention.

A memory cell in a semiconductor memory device of an eighth embodiment has a configuration substantially similar to that of the second embodiment except that, as shown in FIG. 18, the thickness (T1) of the insulating film separating the charge retaining film (silicon nitride film 242) and the channel region or well region is larger than the thickness (T2) of the gate insulating film.

The thickness T2 of the gate insulating film 214 has an upper limit value due to demand of preventing a short channel effect of the device. However, the thickness T1 of the insulating film can be made larger than T2 irrespective of the demand of preventing the short channel effect. Specifically, when reduction in scaling progresses (when reduction in thickness of the gate insulating film progresses), the thickness of the insulating film separating the charge retaining film (silicon nitride film 242) and the channel region or well region can be designed optimally independent of the gate insulating film thickness. Thus, an effect that the memory functional unit does not disturb scaling is obtained.

The reason why flexibility of designing T1 is high in the memory cell is that, as described already, the insulating film separating the charge retaining film and the channel region or well region is not sandwiched by the gate electrode and the channel region or well region. Consequently, irrespective of the demand of preventing the short channel effect for the gate insulating film, T1 can be made thicker than T2.

By making T1 thicker, dissipation of charges accumulated in the memory functional unit can be prevented and the retention characteristic of the memory can be improved.

Therefore, by setting T1>T2, the retention characteristic can be improved without deteriorating the short channel effect of the memory.

The thickness T1 of the insulating film is, preferably, 20 nm or less in consideration of decrease in rewriting speed.

Concretely, in a conventional nonvolatile memory typified by a flash memory, a selection gate electrode serves as a write erase gate electrode, and a gate insulating film (including a floating gate) corresponding to the write erase gate electrode also serves as a charge accumulating film. Since a demand for size reduction (thinning of a film is indispensable to suppress short channel effect) and a demand for assuring reliability (to suppress leak of retained charges, the thickness of the insulating film separating the floating gate and the channel region or well region cannot be reduced to about 7 nm or less) are contradictory, it is difficult to reduce the size. Actually, according to the ITRS (International Technology Roadmap for Semiconductors), there is no prospect of reduction in a physical gate length of about 0.2 micron or less. In the memory cell, since T1 and T2 can be individually designed as described above, size reduction is made possible.

For example, for a memory cell having a gate electrode length (word line width) of 45 nm, T2=4 nm and T1=7 nm are individually set, and a memory cell in which the short channel effect is not produced can be realized. The reason why the short channel effect is not produced even when T2 is set to be thicker than the thickness of a normal logic transistor is because the source/drain regions are offset from the gate electrode.

Since the source/drain regions are offset from the gate electrode in the memory cell, as compared with a normal logic transistor, reduction in size is further facilitated.

Since the electrode for assisting writing and erasing does not exist in the upper part of the memory functional unit, a high electric field acting between the electrode for assisting writing and erasing and the channel region or well region does not directly act on the insulating film separating the charge retaining film and the channel region or well region, but only a relatively low electric field which spreads in the horizontal direction from the gate electrode acts. Consequently, the memory cell having a gate length which is reduced to be equal to or less than the gate length of a logic transistor of the same process generation can be realized.

Ninth Embodiment

A ninth embodiment relates to a change in the electric characteristic at the time of rewriting a memory cell of a semiconductor memory device.

Figure 19:
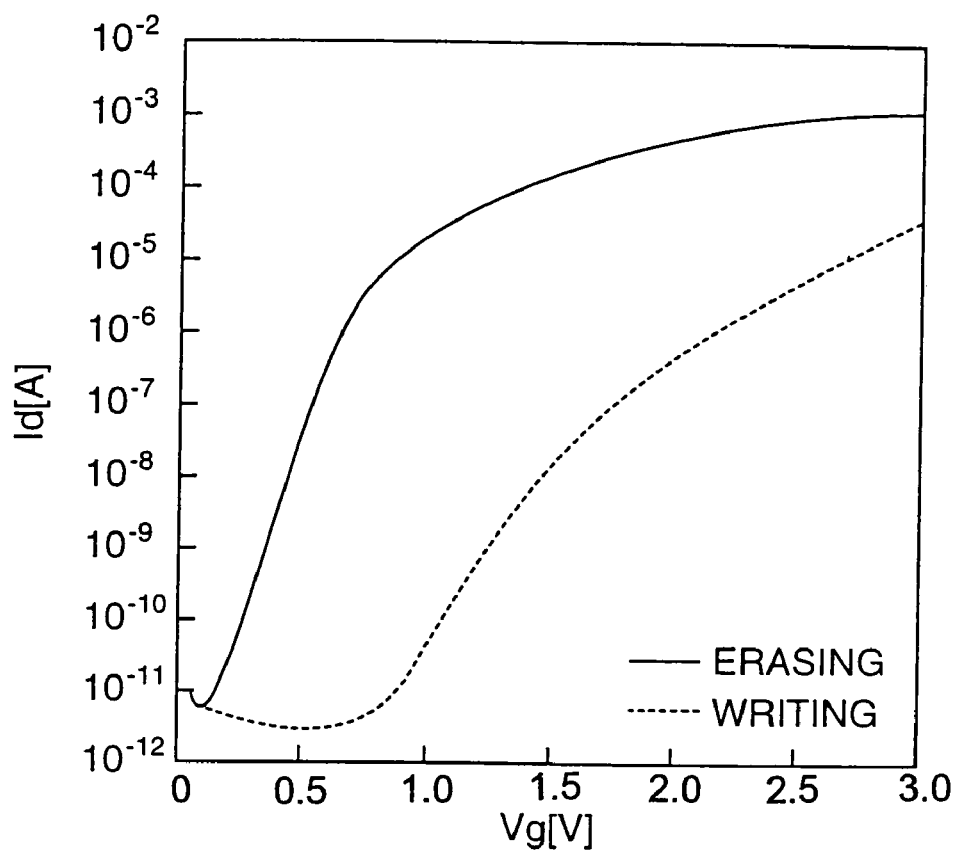
FIG. 19 is a graph showing electric characteristics of a memory cell (ninth embodiment) constituting the nonvolatile memory part in the display driver according to the present invention.

In an N-channel type memory cell, when an amount of charges in a memory functional unit changes, a drain current (Id)-gate voltage (Vg) characteristic (actual measurement value) as shown in FIG. 19 is exhibited.

Figure 23:
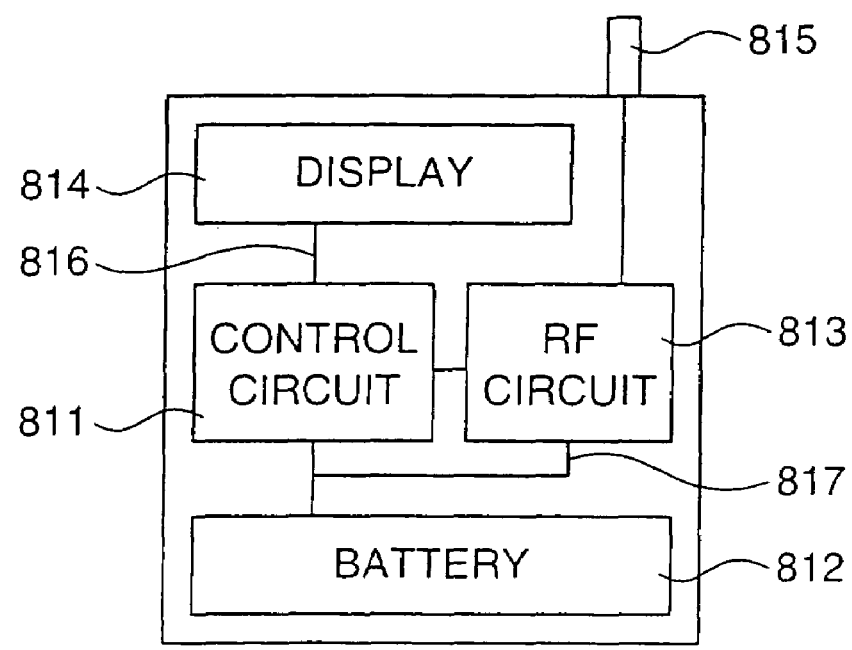
FIG. 23 is a schematic block diagram showing a portable electronic apparatus (thirteenth embodiment) according to the present invention.
Figure 24:
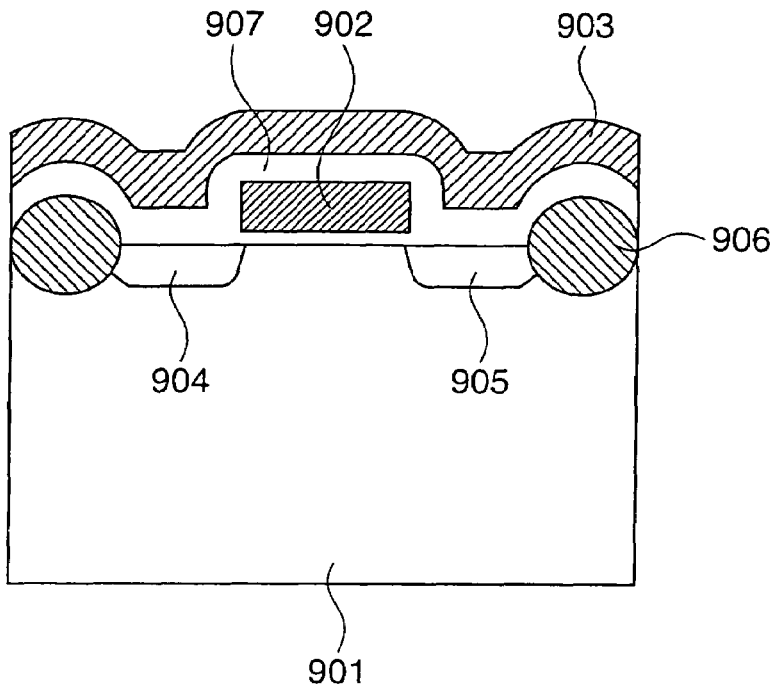
FIG. 24 is a schematic sectional view showing a main part of a conventional flash memory.
Figure 25:
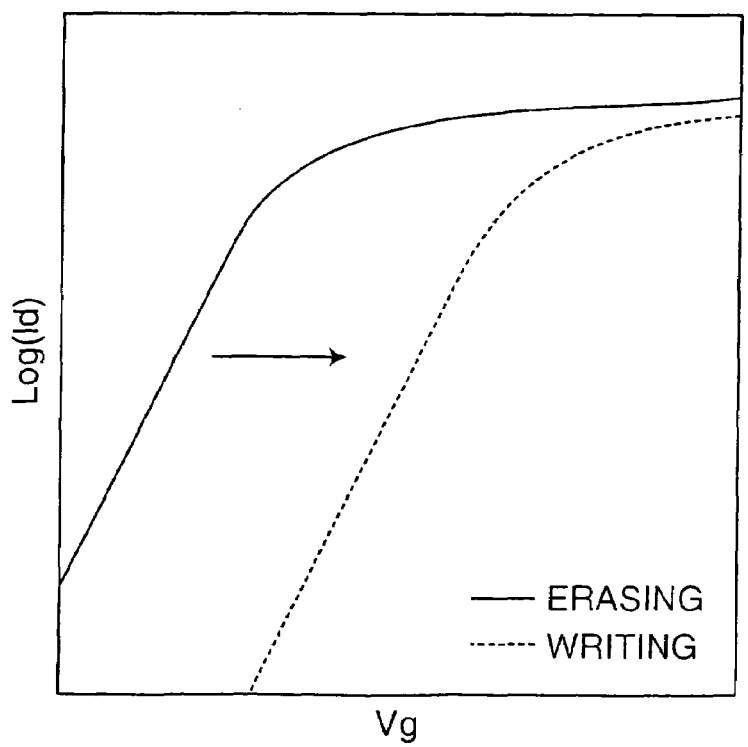
FIG. 25 is a graph showing electric characteristics of a conventional flash memory.

As obvious from FIG. 19, in the case of performing a writing operation in an erasing state (solid line), not only the threshold simply increases, but also the gradient of a graph remarkably decreases in a sub-threshold region. Consequently, also in a region where a gate voltage (Vg) is relatively high, the drain current ratio between the erasing state and the writing state is high. For example, also at Vg=2.5V, the current ratio of two digits or more is maintained. The characteristic is largely different from that in the case of a flash memory (FIG. 23).

Appearance of such a characteristic is a peculiar phenomenon which occurs since the gate electrode and the diffusion region are offset from each other, and the gate electric field does not easily reach the offset region. When the memory cell is in a writing state, even when a positive voltage is applied to the gate electrode, an inversion layer is extremely hard to be formed in the offset region under the memory functional unit. This is the cause that the gradient of the Id-Vg curve is gentle in the sub-threshold region in the writing state.

On the other hand, when the memory cell is in an erasing state, electrons of high density are induced in the offset region. Further, when 0 V is applied to the gate electrode (that is, when the gate electrode is in an off state), electrons are not induced in the channel below the gate electrode (consequently, an off-state current is small). This is the cause that the gradient of the Id-Vg curve is sharp in the sub-threshold region in the erasing state, and current increasing rate (conductance) is high in the region of the threshold or more.

As obviously understood from the above, in the memory cell in the semiconductor memory device of the present invention, the drain current ratio between the writing operation and the erasing operation can be particularly made high.

In the above, the memory cell constituting the nonvolatile memory in the display driver of the present invention has been described.

Hereinafter, a display device using the display driver having the memory cell will be described.

Tenth Embodiment

A tenth embodiment relates to a display device using the display driver having a nonvolatile memory part in which a plurality of memory cells are arranged and each of the memory cells is described in any of the first to eighth embodiments.

The tenth embodiment will be described with respect to the case where a display panel is an active matrix liquid crystal panel. Obviously, the present invention is not limited to the case, and the display panel may be a nematic liquid crystal panel, an EL (electroluminescence) panel, an organic EL panel, a plasma display panel or the like.

Figure 20:
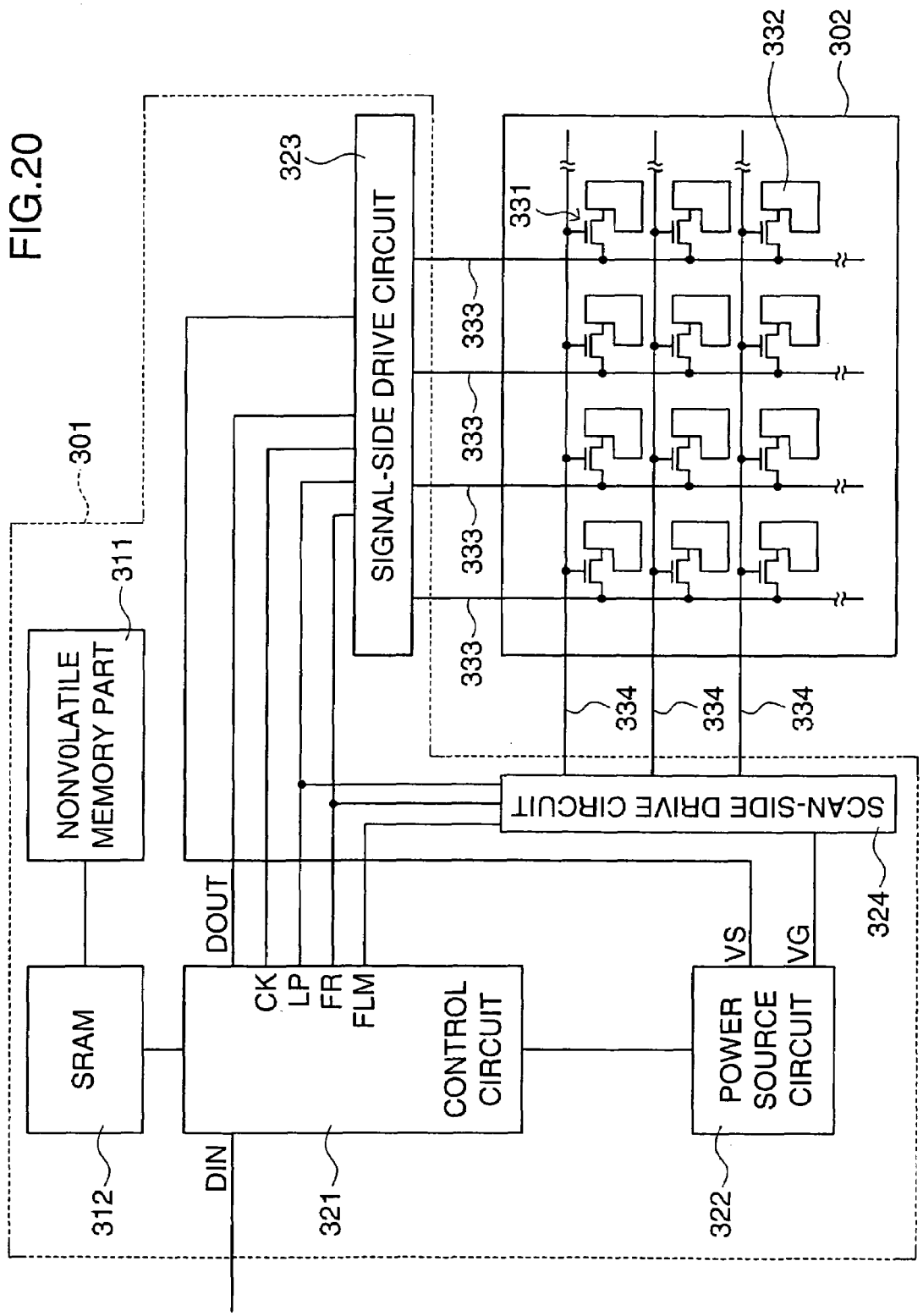
FIG. 20 is a schematic block diagram showing a display device (tenth embodiment) according to the present invention.

The display device is constructed by, as shown in the block diagram of FIG. 20, a display panel 302 and a display driver 301 expressed by a broken line.

The display driver 301 includes a nonvolatile memory part 311 having the memory cells of any of the first to eighth embodiments, an SRAM (Static Random Access Memory) 312, a control circuit (control part) 321, a power source circuit 322, a signal-side drive circuit 323, and a scan-side drive circuit 324. The signal-side drive circuit 323 and the scan-side drive circuit 324 construct the display driving part.

An input data signal DIN is externally inputted to the control circuit 321. The control circuit 321 either processes or passes the input data signal DIN or permits the signal DIN to pass to generate an output data signal DOUT and outputs the output data signal DOUT to the signal-side drive circuit 323. The control circuit 321 also outputs a data shift clock CK to the signal-side drive circuit 323, a scan clock LP and an alternating signal FR to the signal-side drive circuit 323 and the scan-side drive circuit 324, and a scan start signal FLM to the scan-side drive circuit 324.

The power source circuit 322 generates a voltage VS to be supplied to the signal-side drive circuit 323 and a voltage VG to be supplied to the scan-side drive circuit 324. The power source circuit 322 normally supplies a plurality of voltages to each of the signal-side drive circuit 323 and the scan-side drive circuit 324. The voltages are generically expressed as VS and VG.

Pixel electrodes 332 are arranged on the display panel 302. A TFT (Thin Film Transistor) 331 is connected to each of the pixel electrodes 332. Although not shown, the pixel electrodes 332 and the TFTs 331 are formed on a glass substrate, and a common electrode is formed on the entire surface of a facing substrate opposite to the glass substrate. A liquid crystal is sealed between the glass substrate and the facing substrate.

The TFTs 331 are formed on the glass substrate of the display panel 302 and the source electrodes of the TFTs 331 in each column are connected to a signal line 333. The gate electrodes of the TFTs 331 in each row are connected to a scan line 334. The signal lines 333 are connected to the signal-side drive circuit 323, and the scan lines 334 are connected to the scan-side drive circuit 324.

Figure 21:
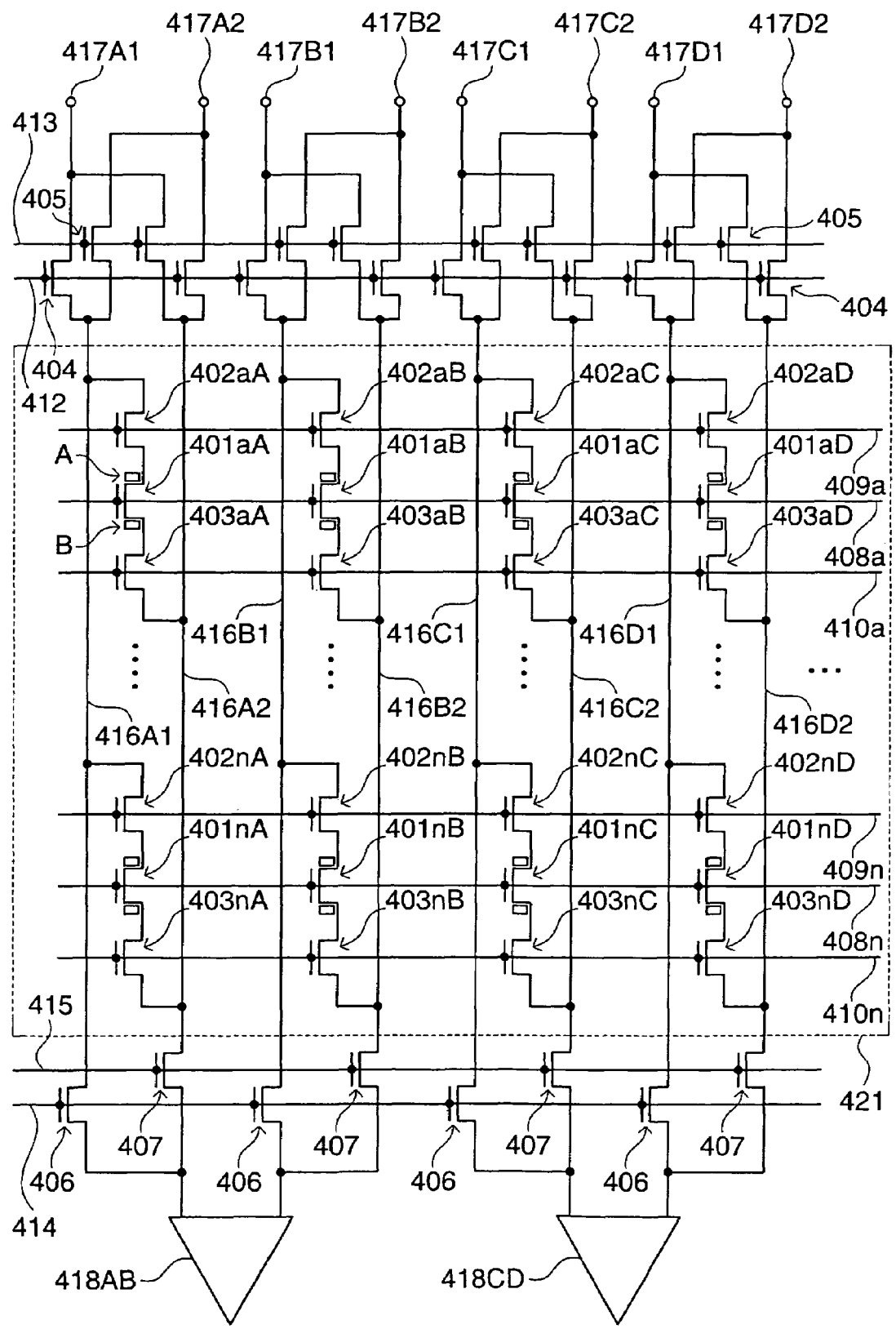
FIG. 21 is a circuit diagram showing a main part of a nonvolatile memory part in the display device (tenth embodiment) according to the present invention.

FIG. 21 is a circuit diagram of a main part of the nonvolatile memory part 311. The nonvolatile memory part 311 includes a memory cell array region 421, a circuit for applying a predetermined rewrite voltage or read voltage to each of the memory cells, sense amplifiers, and a circuit for connecting a sense amplifier to the memory cells. The other peripheral circuits are not shown here.

Memory cells 401aA to 401aD, . . . , and 401nA to 401nD in the memory cell array region 421 are memory cells each of which is described in any of the first to eighth embodiments. Each memory cell has two memory functional units. The two memory functional units A and B of the memory cell 401aA are respectively marked with arrows A and B in FIG. 21 so as to be discriminated from each other, and the arrows are omitted for the other memory cells.

Two selection transistors are connected to both sides of each memory cell. For example, selection transistors 402aA and 403aA are connected in series with the memory cell 401aA.

The gate electrodes of the memory cells 401aA to 401aD are connected to each other via a word line 408a. The gate electrodes of the other memory cells are similarly connected via word lines. Selection transistors 402aA to 402aD are connected to each other via a selection transistor word line 409a, and selection transistors 403aA to 403aD are connected to each other via a selection transistor word line 410a. The gate electrodes of the other selection transistors are also connected similarly via selection transistor word lines.

Each of the selection transistors 402aA to 402nA is connected to a first bit line 416A1, and each of the selection transistors 403aA to 403nA is connected to a second bit line 416A2. The other selection transistors are similarly connected to the first or second bit line.

A pair of operation selection transistors 404 and 405 is connected to each of the bit lines. The operation selection transistors 404 and 405 are connected to first voltage input terminals 417A1 to 417D1 or second voltage input terminals 417A2 to 417D2, respectively. The gate electrodes of the operation selection transistors 404 and 405 are connected to operation selection lines 412 and 413, respectively. When the operation selection line 412 is selected, for example, the first bit line 416A1 is connected to the first voltage input terminal 417A1, and the second bit line 416A2 is connected to the second voltage input terminal 417A2. When the operation selection line 413 is selected, for example, the first bit line 416A1 is connected to the second voltage input terminal 417A2, and the second bit line 416A2 is connected to the first voltage input terminal 417A1. That is, the bit lines 416A1 and 416A2 in one pair are connected to different voltage input terminals. By changing selection of the operation selection line, the voltage input terminal to be connected can be changed.

Two pairs of bit lines (for example, a pair of bit lines 416A1 and 416A2 and a pair of bit lines 416B1 and 416B2) are connected to two input terminals of a sense amplifier via a switch transistor. More specifically, the two pairs of bit lines are connected as follows.

The first bit lines 416A1 to 416D1 are connected to a first switch transistor 406. The second bit lines 416A2 to 416D2 are connected to a second switch transistor 407. The gate electrodes of the switch transistors 406 and 407 are connected to switch transistor selection lines 414 and 415, respectively. When the switch transistor selection line 414 is selected, for example, one of input terminals of a sense amplifier 418AB is connected to the first bit line 416A1, and the other input terminal of the sense amplifier 418AB is connected to the first bit line 416B1. When the switch transistor selection line 415 is selected, for example, one of input terminals of a sense amplifier 418AB is connected to the second bit line 416A2, and the other input terminal of the sense amplifier 418AB is connected to the second bit line 416B2. As the sense amplifier, an amplifier capable of sensing output current from a memory cell, such as, a differential amplifier can be used.

Although four pairs of bit lines are arranged in FIG. 21, bit lines of an arbitrary number of pairs can be arranged. In FIG. 21, two pairs of bit lines are connected to one sense amplifier. As will be described later, this is because selected two memory cells are paired and connected to two input terminals of one sense amplifier.

Alternatively, as another example of constructing the nonvolatile memory part by arranging memory cells, one memory cell may be connected to one of input terminals of a sense amplifier and an external reference cell may be connected to the other input terminal of the sense amplifier.

The operating method of the nonvolatile memory part will be described. The operation of the nonvolatile memory part includes rewriting and reading operations. Further, the rewriting operation includes writing and reading operations.

First, the writing operation will be described. As an example of the writing operation, the case of writing information to the memory cell 401aA will be described.

The operation selection line 412 is selected to turn on the operation selection transistor 404. By this operation, for example, the first bit line 416A1 is connected to the first voltage input terminal 417A1, and the second bit line 416A2 is connected to the second voltage input terminal 417A2. The other bit lines are connected similarly.

Further, the selection transistor word lines 409a and 410a are selected. A diffusion region (on the side of the memory functional unit A) as one of diffusion regions (source and drain) of the memory cell 401aA is connected to the first voltage input terminal 417A1, and the other diffusion region (on the side of the memory functional unit B) is connected to the second voltage input terminal 417A2. The memory cells 401aB to 401aD connected to the word line 408a are connected similarly.

A predetermined voltage for writing is applied to each of the word line 408a and the first and second voltage input terminals 417A1 and 417A2. First, for example, +5V is applied to the word line 408a. Further, +5V is applied to the first voltage input terminal 417A1, and 0V is applied to the second voltage input terminal 417A2. In this manner, information is selectively written to the memory functional unit A of the memory cell 401aA.

When a predetermined voltage is applied to another voltage input terminal in this case, information can be written also to the memory cells 401aB to 401aD. For a memory cell to which no information is written, it is sufficient to apply 0V to the voltage input terminal or set the voltage input terminal into an open state.

In the case of writing information to the memory functional unit B of the memory cell 401aA, it is sufficient to select the selection line 413 in place of the operation selection line 412 and set the other selecting operation and voltage applying conditions similarly. The voltage applied to the first voltage input terminal 417A1 and the voltage applied to the second voltage input terminal 417A2 may be interchanged.

The erasing operation will now be described. As an example of the erasing operation, the case of erasing information in the memory cell 401aA will be described.

In a manner similar to the case of the writing operation, the operation selection line 412 is selected to turn on the operation selection transistor 404, and the selection transistor word lines 409a and 410a are selected.

A predetermined voltage for erasing is applied to each of the word line 408a and the first and second voltage input terminals 417A1 and 417A2. First, for example, −5V is applied to the word line 408a. Further, +5V is applied to the first voltage input terminal 417A1, and 0V is applied to the second voltage input terminal 417A2. In this manner, the information in the memory functional unit A of the memory cell 401aA is selectively erased.

By applying a predetermined voltage to another voltage input terminal at this time, information in the memory cells 401aB to 401aD can be also erased. For a memory cell of which information is not to be erased, it is sufficient to apply 0V to the voltage input terminal or set the voltage input terminal to an open state.

In the case of erasing information in the memory functional unit B of the memory cell 401aA, it is sufficient to select the selection line 413 in place of the operation selection line 412 and set the other selecting operation and voltage applying conditions similarly. The voltage applied to the first voltage input terminal 417A1 and the voltage applied to the second voltage input terminal 417A2 may be interchanged.

The reading operation will now be described. As an example of the reading operation, the case of reading information stored in the memory cell 401aA will be described.

In the case of reading information stored on the side of the memory functional unit A of the memory cell 401aA, the operation selection line 413 is selected to turn on the operation selection transistor 405, and the switch transistor selection line 414 is selected to turn on the first switch transistor 406. Further, a voltage appropriate to the reading operation, for example, +2V is applied to the word line 408a. Subsequently, for example, +1.8V is applied to the first voltage input terminal 417A1. The second voltage input terminal 417A2 is set to an open state.

Under the above selection operation and voltage applying conditions, the current flows from the first voltage input terminal 417A1 to one of the input terminals of the sense amplifier 418AB via the memory cell 401aA. By sensing a value of the current, the information stored in the memory cell 401aA can be determined. Since the memory functional unit A of the memory cell 401aA is the source in this case, an amount of charges accumulated in the memory functional unit A mainly exerts an influence on the value of current flowing in the memory cell 401aA. Consequently, only information stored on the memory functional unit A can be selectively read.

Since the ratio between the drain current in the writing state and the drain current in the erasing state of the memory cell can be made particularly large as described in the ninth embodiment, discrimination between the writing state and the erasing state is easily made. Therefore, in the case of using the memory cells for the nonvolatile memory part of the display driver of the present invention, speed of reading information stored in the nonvolatile memory part is improved, or the configuration of the reading circuit for the nonvolatile memory part can be simplified.

In the case of reading information stored on the memory functional unit B of the memory cell 401aA, it is sufficient to select the operation selection line 412 in place of the operation selection line 413, select the switch transistor selection line 415 in place of the switch transistor selection line 414, and set the other selecting operations and voltage applying conditions similarly.

By further applying a voltage for reading, for example, +1.8 V to the first voltage input terminal 417B1 in the reading operation, current according to the information stored in the memory cell 401aB is supplied to the other input terminal of the sense amplifier 318AB. Therefore, in the embodiment, the sense amplifier 418AB can sense the different between currents flowing in the two memory cells 401aA and 401aB. In this case, information of one bit or two bits is stored by two memory cells. As described above in the reading operation, by inverting the direction of current flowing in memory cells at the time of the reading operation and independently reading the information stored in the memory functional unit A and the information stored in the memory functional unit B, two-bit operation can be performed by two memory cells. On the other hand, by limiting the direction of current flowing in memory cells to one direction at the time of reading operation, one-bit operation can be performed by two memory cells.

In the nonvolatile memory part 311 of the display driver 301, for example, a set value for the display is stored. The nonvolatile memory part 311 has memory cells, each of which is described in any of the first to eighth embodiments. As described above, the size reduction of the memory cells described in any of the first to eighth embodiments is easily achieved and the manufacturing process is simpler than that of an EEPROM having a floating gate, so that the manufacturing cost is low. Therefore, the display driver having a function for storing a set value for the display device is provided at a low cost. Since the difference between current in the writing state and current in the erasing state can be easily made large in the memory cell, in the case of using the memory cells for the nonvolatile memory part of the display driver of the present invention, the speed of reading information stored in the nonvolatile memory part increases or the construction of the reading circuit for the nonvolatile memory part can be simplified.

The manufacturing cost of a display having the display driver of the present invention and a display panel can be also reduced.

In the nonvolatile memory part 311 of the display driver 301, for example, information for controlling a display panel drive signal outputted from the display driver 301 can be stored. More specifically, for example, information for gamma correction (gamma value) of the display can be stored. The gamma correction corrects a voltage applied to each of the pixel electrodes 332 corresponding to each tone.

The gamma value is a parameter indicative of the relation between a tone and a voltage applied to each pixel electrode 332. By making the gamma correction, the relation between the voltage outputted from the signal-side drive circuit 323 and the tone is made proper, and reproducibility of an image displayed on the display can be improved. In addition, by storing chromaticity of RGB (red, green and blue) and a chromaticity point of white in the nonvolatile memory part 311 and allowing those values to be reflected to a display panel drive signal which is outputted from the display driver 301, an image can be displayed with high reproducibility. Further, the three values of the gamma value, the chromaticity of RGB, and the white chromaticity point specify an ICC (International Color Consortium) profile. Thus, the three values enable image adjustment to be performed on the basis of the ICC profile. The nonvolatile memory part 311 of the display driver 301 can store information for specifying the voltage VS to be supplied to the signal-side drive circuit 323 and the voltage VG to be supplied to the scan-side drive circuit 324 from the power source circuit 322. For example, by changing the voltage VS to be supplied to the signal-side drive circuit 323, a voltage applied to each pixel electrode 332 changes, so that the picture quality can be adjusted.

By storing information for controlling the display panel drive signal outputted from the display driver 301 into the nonvolatile memory part 311, an image can be displayed with high reproducibility and variations in the picture quality among displays can be suppressed.

Although the display driver 301 may be formed in such a manner that the nonvolatile memory part 311 is formed on a chip independent of the other parts, it is preferable that the display driver 301 including the nonvolatile memory part 311 be formed on one chip. Since the memory cell described in any of the first to eighth embodiments can be formed by a process having a high affinity with the process of forming a normal standard transistor as described above, the memory cell and the standard transistor can be easily formed on one chip. By forming the display driver 301 on one chip, the number of chips can be decreased and the cost of the display driver can be further reduced.

The display driver 301 may have only the nonvolatile memory part 311 as a memory. In this case, it is sufficient to read information stored in the nonvolatile memory part 311 as necessary. It is, however, preferable that the display driver 301 further include the SRAM 312 as in the embodiment. In this case, by transferring the information stored in the nonvolatile memory part 311 to the SRAM 312 and performing reading operation on the SRAM 312, the stored information can be read at higher speed. Further, the number of times of reading the memory cells constituting the nonvolatile memory part 311 can be largely reduced, so that deterioration of the stored information due to application of a voltage for reading is prevented, and reliability of information retention of the memory cell can be improved. Since the SRAM is constructed by a normal MOSFET, a process is not complicated for forming the driver 301 with the nonvolatile memory part 311 and the SRAM 312 on one chip.

Preferably, power is supplied to the display driver or stopped by power supply/stop means (not shown) provided on the inside or outside of the display driver and, each time the power supply/stop means starts power supply to the display driver, information stored in the nonvolatile memory part 311 is transferred to the SRAM 312. Specifically, it is preferable to transfer stored information from the nonvolatile memory part 311 to the SRAM 312 at the time of turn-on of the power of the display driver. It can prevent interference of the stored information transferring operation in the operation of the display driver. Concretely, for example, it can prevent operation of driving the display panel by the display driver from being disturbed and display of an image from being interrupted. When the stored information is transferred at the time of turn-on of the power of the display driver and, after that, driving of the display panel is started, interruption of an image and the like can be prevented.

Preferably, the display driver further includes means for externally rewriting information stored in the nonvolatile memory part 311. If information stored in the nonvolatile memory part 311 can be externally rewritten, even after the display device is completed by integrating the display panel and the display driver or an apparatus having the display is completed, the information stored in the nonvolatile memory part 311 can be changed. Consequently, for example, the information for image adjustment can be rewritten after testing the completed display. In this manner, by shipping the display devices after compensating manufacture unevenness of display devices, uneven quality of the display devices can be suppressed. In the case where the display device in the apparatus deteriorates with age, the deterioration can be compensated by rewriting the stored information for image adjustment.

In the case of using an organic EL panel or a plasma display panel as the display panel, it is particularly preferable that the display driver is provided with means for externally rewriting information stored in the nonvolatile memory part 311. Since deterioration with age in picture quality of an organic EL panel and a plasma display panel is more conspicuous as compared with that of a liquid crystal panel, it is particularly effective to compensate deterioration after completion of a product. Since manufacture unevenness in an organic EL panel are larger than those of a liquid crystal panel, by providing the display driver with the means for externally rewriting information stored in the nonvolatile memory part, it is particularly effective at suppressing uneven picture quality among display devices.

As the memory cell used in the tenth embodiment, it is preferable to use the memory cell of the seventh embodiment. Specifically, the thickness (T1) of the insulating film for separating the charge retaining film (silicon nitride film 242) from the channel region or well region is preferably smaller than the thickness (T2) of the gate insulating film and not smaller than 0.8 nm. When such a memory cell is used for the nonvolatile memory part, the voltage of the writing operation and the erasing operation can be decreased, or the writing operation and the erasing operation can be performed at a higher speed. Since the memory effect of the memory cell improves, a higher reading speed of the nonvolatile memory part can be achieved. Therefore, lower power consumption and higher operating speed of the display driver can be realized.

As the memory cell used in the tenth embodiment, it is preferable to use the memory cell of the eighth embodiment. Specifically, the thickness (T1) of the insulating film for separating the charge retaining film (silicon nitride film 242) from the channel region or well region is preferably larger than the thickness (T2) of the gate insulating film and not larger than 20 nm. When such a memory cell is used for the nonvolatile memory part, the retention characteristic can be improved without worsening the short channel effect of the memory cell. Consequently, even when the packing density of the nonvolatile memory part is increased, a sufficient retention characteristic can be obtained. Therefore, the performance of the display driver can be improved.

In the memory cell used for the tenth embodiment, preferably, as described in the second embodiment, the charge retaining regions (silicon nitride film 242) in the memory functional units 261 and 262 overlap with the diffusion regions 212 and 213, respectively. When such a memory cell is used for the nonvolatile memory part, the reading speed of the nonvolatile memory part can be sufficiently increased. Therefore, the operation of the display driver can be performed at a higher speed.

In the memory cell used for the embodiment, preferably, as described in the second embodiment, the memory functional unit includes the charge retaining film disposed almost parallel with the surface of the gate insulating film. By using such a memory cell for the nonvolatile memory part, unevenness in the memory effect of the memory cell can be reduced, so that unevenness in the read current of the nonvolatile memory part can be suppressed. Further, a change in the characteristics of the memory cell during information retaining state can be reduced, so that the retention characteristic of the nonvolatile memory part can be improved. Therefore, reliability of the display driver can be improved.

In the memory cell used for the tenth embodiment, preferably, as described in the third embodiment, the memory functional unit includes the charge retaining film disposed almost parallel with the surface of the gate insulating film and includes a part extending almost parallel with a side surface of the gate electrode. When such a memory cell is used for the nonvolatile memory part, a rewriting speed of the memory cell increases, so that the rewriting operation of the nonvolatile memory part can be performed at a higher speed. Therefore, the time required to rewrite information stored in the nonvolatile memory part of the display driver is shortened, and the cost for rewriting is reduced.

It is most preferable to use the memory cell in the best mode as the memory cell used in the tenth embodiment. By using it, the nonvolatile memory part of the display driver can have the best performances.

Eleventh Embodiment

Figure 22:
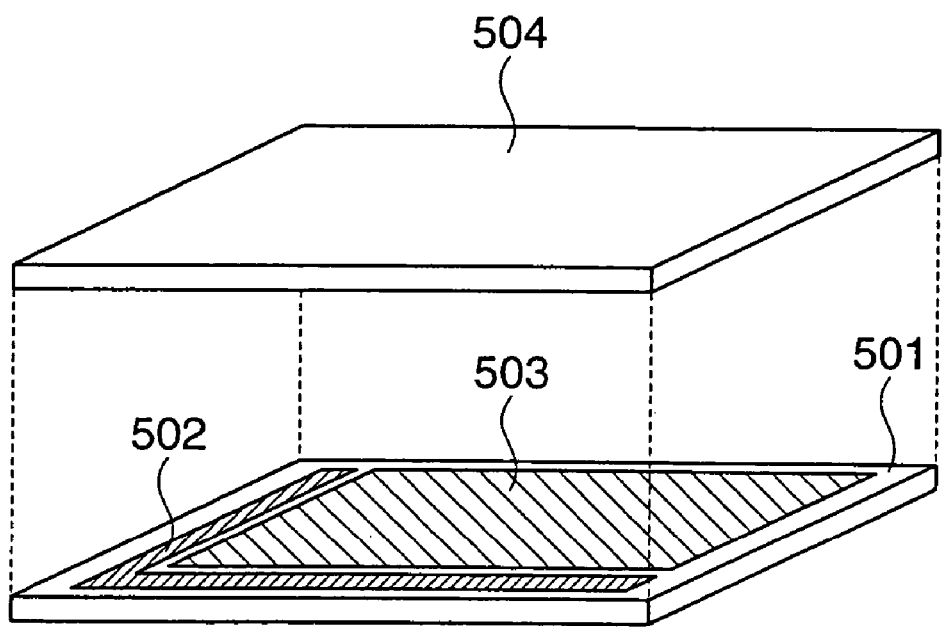
FIG. 22 illustrates a configuration of a display device (eleventh embodiment) according to the present invention.

In an eleventh embodiment, the device constituting the display driver in the display device for the tenth embodiment is formed on a panel substrate of a display panel. FIG. 22 illustrates the structure of the display panel.

On a panel substrate (active matrix substrate) 501, a display driver 502 and an image display part 503 are formed by the TFT technique. The display driver 502 includes a nonvolatile memory part, an SRAM, a control circuit, a power source circuit, a signal-side drive circuit and a scan-side drive circuit. On a facing substrate 504 opposed to the substrate 501, a common electrode, a color filter layer and the like (not shown) are formed. Between the panel substrate 501 and the facing substrate 504, a liquid crystal (not shown) is sealed. Memory cells constituting the nonvolatile memory part can be formed by a process which has a high affinity with a process of forming a normal standard transistor as described above, so that it can be easily formed by using the TFT technique.

By forming the display driver on the display panel as described above, it becomes unnecessary to externally attach an outer display driver to the display panel. The display driver and the display panel can be formed integrally, so that the manufacturing cost of the display can be reduced.

Twelfth Embodiment

A twelfth embodiment relates to another example of information to be stored in the nonvolatile memory part 311 in the display device of the tenth embodiment.

As information to be stored in the nonvolatile memory part 311, for example, information peculiar to each of displays can be used. The peculiar information includes, for example, a production number, a production identification number, or a repair history. By storing the peculiar information, for example, maintenance of the display device and services to the customers can be provided promptly.

A first sign is stored in the nonvolatile memory part 311, image data including a second sign is inputted to the display driver, and collating means of the display driver determines whether the first and second signs match each other or not. When the collating means determines a mismatch of the signs, the display driver can prevent at least a part of image data from being inputted to the display driver. In this case, for example, the collating means compares the first and second signs with each other. Only in the case where the collating means determines the match, a normal image can be displayed. By this method, the normal image can be displayed only on a specific display device. Thus, the present invention can be applied to enhancement of security and to delivery of pay images. The collating means does not always have to determine a match only in the case where the first and second signs are the same. For example, the collating means may have a function of converting the second sign and, only when the converted second sign and the first sign match each other, determine the match.

Further, in the case where the collating means determines the mismatch, the display driver performs a process, which is different from a process performed in the case where the collating means determines the match, thereby enabling the present invention to be applied to the enhancement of security and the delivery of pay images. Concretely, for example, it is sufficient to perform a decoding process on encoded image data inputted to the display driver only when the collating means determines the match. As another example, only when the collating means determines the mismatch, a specific process (scramble process, mosaic process or the like) may be performed on the image data.

Thirteenth Embodiment

FIG. 23 shows a portable telephone as a portable electronic apparatus in which the above mentioned display is assembled.

The portable telephone is constructed mainly by a control circuit 811, a battery 812, an RF (radio frequency) circuit 813, a display device 814, an antenna 815, a signal line 816, a power source line 817 and the like. Since the display driver is assembled in the display device 814, cost reduction and high performance can be achieved. It is therefore possible to provide an inexpensive portable electronic apparatus with high performance.

The display driver of the present invention has a nonvolatile memory cell. Size reduction of the nonvolatile memory cell is easily achieved and the manufacturing process is simpler than that of an EEPROM having a floating gate, so that the manufacturing cost is low. Therefore, the display driver having the nonvolatile memory can be provided at low cost. Since the difference between current in the writing state and current in the erasing state can be easily made large in the nonvolatile memory cell, the speed of reading information stored in the nonvolatile memory cell can be increased or the configuration of the reading circuit accompanying the nonvolatile memory cell can be simplified.

When the display driver is formed on one chip, the number of chips can be decreased, so that the cost can be reduced.

Further, since the nonvolatile memory cell can be formed by a process having a high affinity with the process of forming a normal standard transistor, a nonvolatile memory cell and a standard transistor can be easily formed simultaneously. Therefore, increase in the number of processes by forming both a nonvolatile memory cell and a standard transistor can be minimized.

By transferring information stored in the nonvolatile memory cell to a static random access memory and performing the reading operation on the static random access memory, the stored information can be read at a higher speed. Further, since the number of reading operations for the nonvolatile memory can be largely decreased, deterioration of stored information due to application of voltage at the time of the reading operation can be prevented, and reliability for information retention of the nonvolatile memory cell can be improved. In addition, since the static random access memory can be constructed by the standard MOSFET, there is no complicated process to form the nonvolatile memory cell and the standard MOSFET on a single chip.

By transferring information stored in the nonvolatile memory cell to a static random access memory at the time of turn-on of the display driver, the operation of the display driver can be prevented from being interfered by the stored information transferring operation.

By enabling externally rewriting of information stored in the nonvolatile memory cell, even after a display is completed by attaching the display driver to the display panel or an apparatus having the display is completed, information stored in the nonvolatile memory cell can be changed. Consequently, for example, information for image adjustment can be rewritten after testing the completed display, so that unevenness in displays can be suppressed. In the case where the display deteriorates with time in the apparatus having the display, the deterioration can be compensated by rewriting information for image adjustment.

When information for controlling a display panel drive signal is stored in the nonvolatile memory, an image can be displayed with high reproducibility and uneven picture quality among display devices can be suppressed.

A first sign and a second sign are compared with each other by collating means and, only in the case where the collating means determines a match, a normal image is displayed. By the method, a desired image can be displayed only on a specific display. Thus, the present invention can be applied to enhancement of security and to delivery of pay images.

The memory functional unit is formed so that at least a part thereof overlaps with a part of the diffusion region, thereby enabling the reading speed of the nonvolatile memory cell to be sufficiently increased. Therefore, the operation of the display driver can be performed at a higher speed.

The memory functional unit includes a retaining film having a function for retaining charges, and a surface of the retaining film is disposed almost parallel with a surface of the gate insulating film, thereby enabling unevenness in the memory effect of the nonvolatile memory cell to be reduced. Accordingly, unevenness in the read current of the nonvolatile memory cell can be suppressed. Further, a change in the characteristics of the nonvolatile memory cell during an information retaining state can be reduced, so that the retention characteristic of the nonvolatile memory cell can be improved. Therefore, reliability of the display driver is improved.

The retaining film is disposed almost parallel with a side surface of the gate electrode, thereby increasing rewriting speed of the nonvolatile memory cell, so that the rewriting operation of the nonvolatile memory cell can be performed at a higher speed. Therefore, the time required to rewrite information stored in the nonvolatile memory cell of the display driver is shortened, and the cost for rewriting is reduced.

The memory functional unit has a retaining film having a function for retaining charges and an insulating film which separates the retaining film from the channel region or the semiconductor layer, and the insulating film is thinner than the gate insulating film and is 0.8 nm or more. With the configuration, voltage in the writing operation and the erasing operation of the nonvolatile memory cell can be decreased or the writing operation and the erasing operation can be performed at a higher speed. Since the memory effect of the nonvolatile memory cell increases, reading speed of the nonvolatile memory part can be increased. Therefore, lower power consumption and higher operating speed of the display driver can be realized.

The memory functional unit includes a retaining film having a function for retaining charges and an insulating film for separating the film from the channel region or the semiconductor layer, and the insulating film is thicker than a gate insulating film and has a thickness of 20 nm or less. With the configuration, the retention characteristic can be improved without worsening the short channel effect of the nonvolatile memory cell. Consequently, even when the packing density of the nonvolatile memory cell is increased, a sufficient retention characteristic can be obtained. Therefore, the performance of the display driver can be improved.

Since the display of the present invention has the display driver of the present invention, while maintaining the function obtained by providing the nonvolatile memory, the manufacturing cost can be reduced.

A device as a component of the display driver is formed on a panel substrate of a display panel, so that it is unnecessary to externally attach the display driver to the display panel but the display driver and the display panel can be formed integrally. Therefore, the manufacturing cost of the display can be reduced.

Since a portable electronic apparatus of the present invention has the display of the present invention, the portable electronic apparatus can be manufactured at a low cost or the performance of the portable electronic apparatus can be improved. Therefore, the cheap or high-performance portable electronic apparatus can be obtained.

What is claimed is:

1. A display driver, comprising:
 a display driving part for receiving image data and outputting a drive signal to a display panel;
 a nonvolatile memory part for storing control information for controlling output of the display driving part, the nonvolatile memory cell having a nonvolatile memory cell and including a gate electrode formed on a semiconductor layer via a gate insulating film, a channel region disposed under the gate electrode, diffusion regions disposed on both sides of the channel region and having a conductive type opposite to that of the channel region, and memory functional units formed on both sides of the gate electrode and having a function for retaining charges; and a control part for controlling output of the display driving part on the basis of the control information.

2. The display driver according to claim 1, wherein the display driving part is formed together with the nonvolatile memory part and the control part on a single chip.

3. The display driver according to claim 1, further comprising:

a static random access memory.

4. The display driver according to claim 3, further comprising:

power supply/stop means for supplying and stopping power to the display driving part, wherein the nonvolatile memory part transfers the stored control information to the static random access memory each time the power supply/stop means starts supplying the power to the display driving part.

5. The display driver according to claim 1, further comprising:

means for externally rewriting the control information stored in the nonvolatile memory part.

6. The display driver according to claim 1, further comprising:

collating means, wherein control information including a first sign is stored in the nonvolatile memory part, image data including a second sign is inputted to the display driving part, the collating means collates the first and second signs with each other and, when the first and second signs do not match each other, the display driving part prevents at least a part of the image data from being output.

7. The display driver according to claim 1, further comprising:

collating means, wherein the control information including a first sign is stored in the nonvolatile memory part, image data including a second sign is inputted to the display driving part, the collating means collates the first and second signs each other to determine whether the first and second signs match or not, and the display driving part outputs a drive signal to the display panel, the drive signal varying according to a determination of the collating means.

8. The display driver according to claim 1, wherein the memory functional unit is formed so that at least a part of the memory functional unit overlaps with a part of the diffusion region.

9. The display driver according to claim 1, wherein the memory functional unit includes a retaining film having a function for retaining charges, and a surface of the retaining film is disposed almost parallel with a surface of the gate insulating film.

10. The display driver according to claim 9, wherein the retaining film is disposed almost parallel with a side surface of the gate electrode.

11. The display driver according to claim 1, wherein the memory functional unit includes a retaining film having a function for retaining charges and an insulating film for separating the retaining film from one of the channel region and the semiconductor layer, and the insulating film has a thickness thinner than the gate insulating film and not thinner than 0.8 nm.

12. The display driver according to claim 1, wherein the memory functional unit includes a retaining film having a function for retaining charges and an insulating film for separating the retaining film from one of the channel region and the semiconductor layer, and the insulating film has a thickness thicker than the gate insulating film and not thicker than 20 nm.

13. A display device comprising:

the display driver according to claim 1; and a display panel driven by the display driver.

14. The display device according to claim 13, further comprising:

a panel substrate as a component of the display panel, wherein the display driver is formed on the panel substrate.

15. A portable electronic apparatus, comprising:

the display driver according to claim 1.

* * * * *